US012632621B2

(12) United States Patent　　　(10) Patent No.: US 12,632,621 B2
Irshad et al.　　　　　　　　　　　(45) Date of Patent: May 19, 2026

(54) IMPLICIT REPRESENTATIONS FOR MULTI-OBJECT SHAPE, APPEARANCE, AND POSE OPTIMIZATION

(71) Applicant: TOYOTA RESEARCH INSTITUTE, INC., Los Altos, CA (US)

(72) Inventors: Muhammad Zubair Irshad, Atlanta, GA (US); Sergey Zakharov, San Francisco, CA (US); Rares A. Ambrus, San Francisco, CA (US); Adrien D. Gaidon, Los Altos, CA (US)

(73) Assignees: TOYOTA RESEARCH INSTITUTE, INC., Los Altos, CA (US); TOYOTA JIDOSHA KABUSHIKI KAISHA, Toyota (JP)

( * ) Notice: Subject to any disclaimer, the term of this patent is extended or adjusted under 35 U.S.C. 154(b) by 974 days.

(21) Appl. No.: 17/868,614

(22) Filed: Jul. 19, 2022

(65) Prior Publication Data

US 2024/0028792 A1　　Jan. 25, 2024

(51) Int. Cl.
　*G06F 30/23*　　　(2020.01)
　*G06F 30/27*　　　(2020.01)
　*G06T 7/50*　　　(2017.01)
(52) U.S. Cl.
　CPC .............. *G06F 30/23* (2020.01); *G06F 30/27* (2020.01); *G06T 7/50* (2017.01)
(58) Field of Classification Search
　CPC .......... G06F 30/23; G06F 30/27; G06F 30/25; G06F 30/367; G06F 30/398; G06T 7/50;
(Continued)

(56) References Cited

U.S. PATENT DOCUMENTS 10,579,907 B1　3/2020　Kim
10,699,192 B1　6/2020　Kim
(Continued)

FOREIGN PATENT DOCUMENTS

CN　105488809 B　4/2018
CN　109658449 B　7/2020
(Continued)

OTHER PUBLICATIONS

Wang, Nanyang, et al. "Pixel2mesh: Generating 3d mesh models from single rgb images." Proceedings of the European conference on computer vision (ECCV). 2018. (Year: 2018).*
(Continued)

*Primary Examiner* — Saif A Alhija
(74) *Attorney, Agent, or Firm* — SHEPPARD, MULLIN, RICHTER & HAMPTON LLP; Daniel N. Yannuzzi

(57)　　　ABSTRACT

The disclosure provides implicit representations for multi-object 3D shape, 6D pose and size, and appearance optimization, including obtaining shape, 6D pose and size, and appearance codes. Training is employed using shape and appearance priors from an implicit joint differential database. 2D masks are also obtained and are used in an optimization process that utilizes a combined loss minimizing function and an Octree-based coarse-to-fine differentiable optimization to jointly optimize the latest shape, appearance, pose and size, and 2D masks. An object surface is recovered from the latest shape codes to a desired resolution level. The database represents shapes as Signed Distance Fields (SDF), and appearance as Texture Fields (TF).

20 Claims, 8 Drawing Sheets

(58) Field of Classification Search
CPC ...... G06V 20/56; G06V 10/454; G06V 10/46;
G06V 10/54; G06V 10/774; G06V 10/82;
G06V 20/64
See application file for complete search history.

(56) References Cited

U.S. PATENT DOCUMENTS

| | | | |
|---|---|---|---|
| 10,909,369 | B2 | 2/2021 | Cansizoglu |
| 11,030,772 | B2 | 6/2021 | Dixit |
| 11,074,711 | B1 | 7/2021 | Akbas |
| 11,302,028 | B2 | 4/2022 | Yao |
| 2019/0172219 | A1 | 6/2019 | Bharara |
| 2021/0149022 | A1 | 5/2021 | Kehl |
| 2021/0237764 | A1 | 8/2021 | Tang |

FOREIGN PATENT DOCUMENTS

| | | |
|---|---|---|
| CN | 111428719 A | 7/2020 |
| CN | 113012122 A | 6/2021 |
| CN | 113393503 A | 9/2021 |

OTHER PUBLICATIONS

Pavlakos, Georgios, et al. "Learning to estimate 3D human pose and shape from a single color image." Proceedings of the IEEE conference on computer vision and pattern recognition. 2018. (Year: 2018).*
Ge, Liuhao, Zhou Ren, and Junsong Yuan. "Point-to-point regression pointnet for 3d hand pose estimation." Proceedings of the European conference on computer vision (ECCV). 2018. (Year: 2018).*
Do, Thanh-Toan, et al. "Deep-6dpose: Recovering 6d object pose from a single rgb image." arXiv preprint arXiv:1802.10367 (2018). (Year: 2018).*
Irshad et al., "CenterSnap: Single-Shot Multi-Object 3D Shape Reconstruction and Categorical 6D Pose and Size Estimation," accepted to IEEE International Conference on Robotics and Automation 2022, Mar. 3, 2022, 9 pages (https://doi.org/10.48550/arXiv.2203.01929).
Chen et al., "Category Level Object Pose Estimation via Neural Analysis-by-Synthesis," European Conference on Computer Vision 2020, 12371:139-156, Aug. 2020 (https://doi.org/10.1007/978-3-030-58574-7_9).
Wang et al., "Normalized Object Coordinate Space for Category-Level 6D Object Pose and Size Estimation," 2019 IEEE/CVF Conference on Computer Vision and Pattern Recognition (CVPR), Jun. 18, 2019, pp. 2642-2651 (https://doi.org/10.1109/CVPR.2019.00275).
Zakharov et al., "Single-Shot Scene Reconstruction," Proceedings of the 5th Conference on Robot Learning, PMLR 164:501-512, Nov. 2021 (https://proceedings.mlr.press/v164/zakharov22a/zakharov22a.pdf).
Zakharov et al., "Autolabeling 3D Objects with Differentiable Rendering of SDF Shape Priors," 2020 IEEE/CVF Conference on Computer Vision and Pattern Recognition (CVPR), Jun. 18, 2020, pp. 12224-12233 (https://doi.org/10.1109/CVPR42600.2020.01224).
Guizilini et al., "Semantically-Guided Representation Learning for Self-Supervised Monocular Depth," Proceedings of the Eighth International Conference on Learning Representations (ICLR 2020), Apr. 2020, pp. 1-14 (https://openreview.net/pdf?id=ByxT7TNFvH).

Guizilini et al., "3D Packing for Self-Supervised Monocular Depth Estimation," Proceedings of the IEEE/CVF Conference on Computer Vision and Pattern Recognition (CVPR), Jun. 16, 2020. pp. 2485-2494 (https://openaccess.thecvf.com/content_CVPR_2020/papers/Guizilini_3D_Packing_for_Self-Supervised_Monocular_Depth_Estimation_CVPR_2020_paper.pdf).
Zakharov et al., "DPOD: 6D Pose Object Detector and Refiner," Proceedings of the IEEE International Conference on Computer Vision, pp. 1941-1950, Oct. 29, 2019 (https://openaccess.thecvf.com/content_ICCV_2019/papers/Zakharov_DPOD_6D_Pose_Object_Detector_and_Refiner_ICCV_2019_paper.pdf).
Park et al., "Pix2Pose: Pixel-Wise Coordinate Regression of Objects for 6D Pose Estimation," Proceedings of the IEEE International Conference on Computer Vision, pp. 7668-7677, Nov. 1, 2019 (https://openaccess.thecvf.com/content_ICCV_2019/papers/Park_Pix2Pose_Pixel-Wise_Coordinate_Regression_of_Objects_for_6D_Pose_Estimation_ICCV_2019_paper.pdf).
Li et al., "CDPN: Coordinates-Based Disentangled Pose Network for Real-Time RGB-Based 6-DoF Object Pose Estimation," Proceedings of the IEEE International Conference on Computer Vision, pp. 7678-7687, Nov. 1, 2019 (https://openaccess.thecvf.com/content_ICCV_2019/papers/Li_CDPN_Coordinates-Based_Disentangled_Pose_Network_for_Real-Time_RGB-Based_6-DoF_Object_ICCV_2019_paper.pdf).
Park et al., "DeepSDF: Learning Continuous Signed Distance Functions for Shape Representation," Proceedings of the IEEE/CVF Conference on Computer Vision and Pattern Recognition (CVPR), Jun. 18, 2019, pp. 165-174 (https://openaccess.thecvf.com/content_CVPR_2019/papers/Park_DeepSDF_Learning_Continuous_Signed_Distance_Functions_for_Shape_Representation_CVPR_2019_paper.pdf).
Mescheder et al., "Occupancy Networks: Learning 3D Reconstruction in Function Space," Proceedings of the IEEE/CVF Conference on Computer Vision and Pattern Recognition (CVPR), Jun. 19, 2019, pp. 4460-4470 (https://openaccess.thecvf.com/content_CVPR_2019/papers/Mescheder_Occupancy_Networks_Learning_3D_Reconstruction_in_Function_Space_CVPR_2019_paper.pdf).
Chen et al., "Learning Implicit Fields for Generative Shape Modeling," Proceedings of the IEEE/CVF Conference on Computer Vision and Pattern Recognition (CVPR), Jun. 19, 2019, pp. 5939-5948 (https://openaccess.thecvf.com/content_CVPR_2019/papers/Chen_Learning_Implicit_Fields_for_Generative_Shape_Modeling_CVPR_2019_paper.pdf).
Chabra et al., "Deep Local Shapes: Learning Local SDF Priors for Detailed 3D Reconstruction," European Conference on Computer Vision, Oct. 7, 2020, 12374:608-625 (https://doi.org/10.1007/978-3-030-58526-6_36).
Takikawa et al., "Neural Geometric Level of Detail: Real-Time Rendering with Implicit 3D Shapes," Proceedings of the IEEE/CVF Conference on Computer Vision and Pattern Recognition (CVPR), Jun. 24, 2021, pp. 11358-11367 (https://openaccess.thecvf.com/content/CVPR2021/papers/Takikawa_Neural_Geometric_Level_of_Detail_Real-Time_Rendering_With_Implicit_3D_CVPR_2021_paper.pdf).
Deng et al., "NASA: Neural Articulated Shape Approximation," European Conference on Computer Vision, Nov. 9, 2020, 12352:612-328 (https://doi.org/10.1007/978-3-030-58571-6_36).
Carion et al., "End-to-End Object Detection with Transformers," European Conference on Computer Vision, Nov. 3, 2020, 12346:213-229 (https://doi.org/10.1007/978-3-030-58452-8_13).
Zakharov et al., "Single-Shot Scene Reconstruction," U.S. Appl. No. 63/243,984, filed Jun. 24, 2021.

* cited by examiner

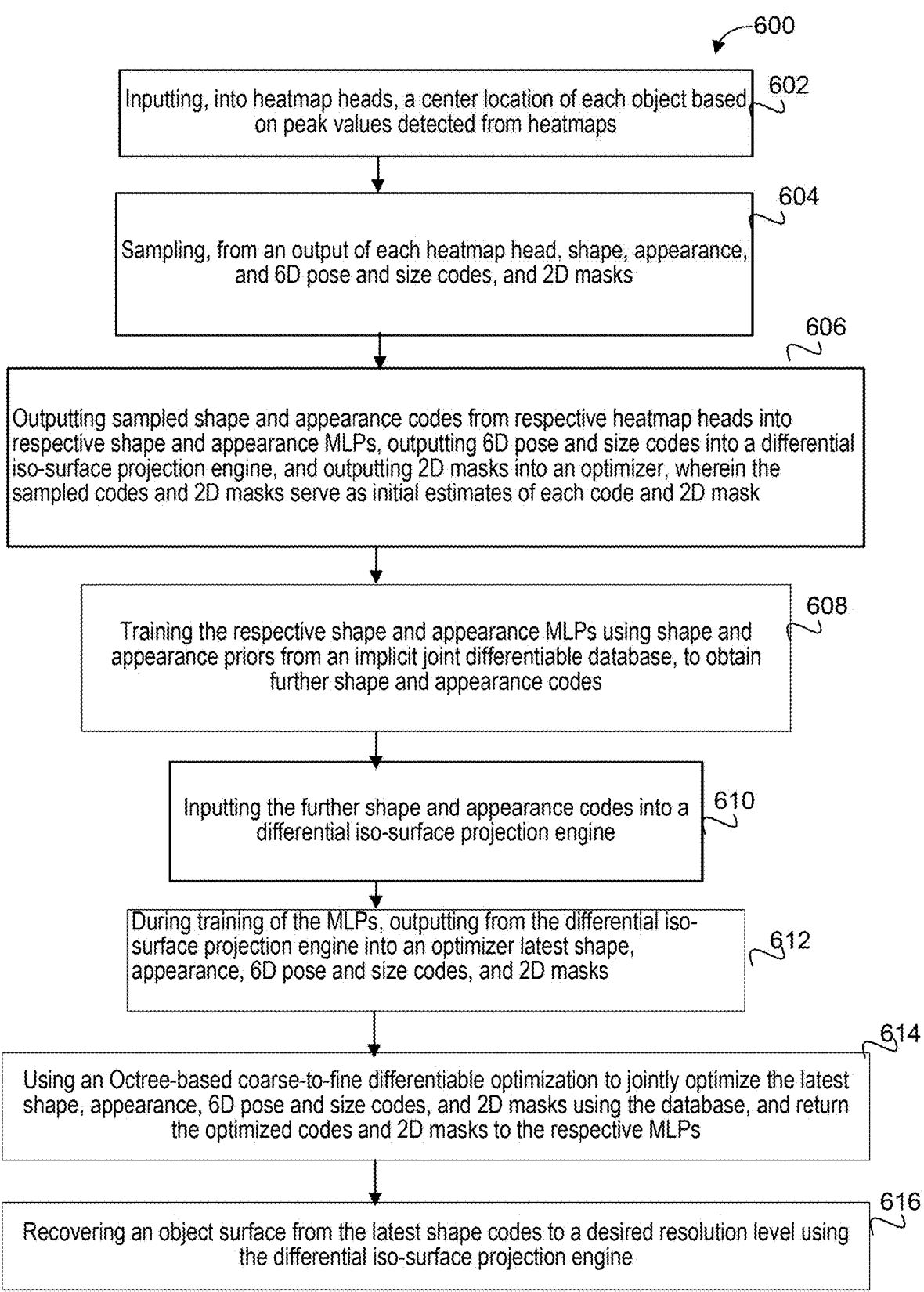

600

602
Inputting, into heatmap heads, a center location of each object based on peak values detected from heatmaps 604
Sampling, from an output of each heatmap head, shape, appearance, and 6D pose and size codes, and 2D masks 606
Outputting sampled shape and appearance codes from respective heatmap heads into respective shape and appearance MLPs, outputting 6D pose and size codes into a differential iso-surface projection engine, and outputting 2D masks into an optimizer, wherein the sampled codes and 2D masks serve as initial estimates of each code and 2D mask 608
Training the respective shape and appearance MLPs using shape and appearance priors from an implicit joint differentiable database, to obtain further shape and appearance codes 610
Inputting the further shape and appearance codes into a differential iso-surface projection engine 612
During training of the MLPs, outputting from the differential iso-surface projection engine into an optimizer latest shape, appearance, 6D pose and size codes, and 2D masks 614
Using an Octree-based coarse-to-fine differentiable optimization to jointly optimize the latest shape, appearance, 6D pose and size codes, and 2D masks using the database, and return the optimized codes and 2D masks to the respective MLPs 616
Recovering an object surface from the latest shape codes to a desired resolution level using the differential iso-surface projection engine

FIG. 6

IMPLICIT REPRESENTATIONS FOR MULTI-OBJECT SHAPE, APPEARANCE, AND POSE OPTIMIZATION

TECHNICAL FIELD

The present disclosure relates generally to simultaneous multi-object three-dimensional (3D) shape reconstruction and six-dimensional (6D) pose and size along with appearance estimation from a red green blue depth (RGB-D) image, and in particular, some implementations may relate to shape, 6D pose and size, and appearance prediction and optimization using texture codes and 2D masks.

DESCRIPTION OF RELATED ART

Multi-object 3D shape reconstruction and 6D pose and size estimation from raw visual observations (e.g., RGB-D images) is important in a variety of technological areas, including autonomous navigation of vehicles, robotics manipulation, augmented reality, and scene understanding, among others. As is known in the art, pose broadly refers to 3D orientation and position. 3D shape reconstruction enables a system to obtain a fine-grained understanding of local geometry, which may be useful in scenarios such as robotics grasping. Furthermore, a system that is able to perform 6D pose estimation in real-time can lead to fast-feedback control.

However, 3D object understanding from a single RGB-D observation has remained a challenging problem in computer vision and robotics because inferring 3D shape from images is an ill-posed problem and predicting the 6D pose and 3D size or scale can be extremely ambiguous if prior information about the objects of interest is not available. It is a challenging problem when CAD models are not available in inference time. Existing methods suffer from low performance for both 3D shape and 6D pose estimation in complex multi-object scenarios, particularly when occlusions are present.

Some systems are able to perform instance-level 6D pose estimation on an RGB-D image that includes objects, where exact 3D models of the objects and sizes of the objects are known a priori. Accordingly, such systems cast object pose estimation as an instance-level 3D object understanding task, as opposed to a category-level task. Instance-level methods rely on provided 3D reconstructions or prior CAD models for successful detection and pose estimation. Category-level pose-estimation approaches, on the other hand, rely on learned shape and scale priors during training, making them significantly more challenging. The performance of these approaches has not been optimal due to their incapacity to express shape variations explicitly.

Moreover, category-level systems tend to employ a two-stage or multi-stage pipeline. In a first stage of the pipeline the system uses two-dimensional (2D) detectors to establish anchors and bounding boxes around each object instance in a RGB-D image. In a subsequent second stage of the pipeline, the system performs object reconstruction and/or 6D pose and size estimation on each object instance separately. The aforementioned multi-stage pipeline approach can tend to be computationally expensive, not suitable for real-time use, not scalable, and exhibit poor performance on real-world, unseen object instances due to an inability to express explicit representations of shape variations within a category.

BRIEF SUMMARY OF THE DISCLOSURE

Example embodiments of the disclosed technology provide implicit representations for multi-object 3D shape, appearance, and 6D pose and size optimization. In an example the disclosure includes obtaining shape, pose and size, and appearance codes. 2D masks are also obtained and are used in an optimization process. Accordingly by virtue of the features of the disclosed technology improved techniques for providing implicit representations can be realized. It is noted that appearance corresponds to texture, and as such, "appearance" and "texture" are referred to interchangeably in this disclosure. "Size" and "scales" are also referred to interchangeably in this disclosure.

In an example embodiment of the disclosed technology, a computer-implemented method comprises the following steps. Inputting an RGB-D image. Extracting RGB features and Depth features from the inputted RGB-D image. Concatenating the extracted RGB features and the extracted Depth features along a convolutional channel to generate concatenated features. Generating a feature pyramid based upon the concatenated RGB features and the concatenated Depth features. Predicting object-centric heatmaps based upon the feature pyramid. Determining peak values in the heatmaps corresponding to centers of the objects in the RGB-D image. Detecting and outputting a center location of each object based on the peak values in the heatmaps.

Once a center location of each object is detected the method further includes the following steps. Inputting, into heatmap heads, a center location of each object based on peak values detected from heatmaps. Sampling, from an output of each heatmap head, shape, appearance, and 6D pose and size codes, and 2D masks. Outputting sampled shape and appearance codes from respective heatmap heads into respective shape and appearance multi-layer perceptrons (MLPs), outputting 6D pose and size codes into a differential iso-surface projection engine, and outputting 2D masks into an optimizer, wherein the sampled codes and 2D masks serve as initial estimates of each code and 2D mask. Training the respective shape and appearance MLPs using shape and appearance priors from an implicit joint differentiable database, to obtain further shape and appearance codes. Inputting the further shape and appearance codes into a differential iso-surface projection engine. During training of the MLPs, outputting from the differential iso-surface projection engine into the optimizer latest shape, appearance, 6D pose and size codes, and 2D masks. Using an Octree-based coarse-to-fine differentiable optimization to jointly optimize the latest shape, appearance, 6D pose and size codes, and 2D masks, and return the optimized codes and 2D masks to the respective MLPs. Recovering an object surface from the latest shape codes to a desired resolution level using the differential iso-surface projection engine.

In examples the database represents shapes as Signed Distance Fields (SDF) and appearance as Texture Fields (TF).

Other features and aspects of the disclosed technology will become apparent from the following detailed description, taken in conjunction with the accompanying drawings, which illustrate, by way of example, the features in accordance with embodiments of the disclosed technology. The summary is not intended to limit the scope of any inventions described herein, which are defined solely by the claims attached hereto.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

FIG. 6 shows processes performed by prediction and optimizer modules, according to example embodiments.

The figures are not exhaustive and do not limit the present disclosure to the precise form disclosed.

DETAILED DESCRIPTION

Examples of the present disclosure provide implicit representations for multi-object Shape, Appearance, and Pose Optimization. This is referred to as "ShAPO" herein and more broadly may include (but not be limited to) detecting, estimating, or predicting shape, appearance, 6D pose and size of objects, and optimizing shape, pose, and appearance using segmentation masks and novel single-view observations along with an implicit joint differentiable database. The ShAPO system 170 of FIG. 1, discussed in detail below, provides an example embodiment. The ShAPO system 170 includes obtaining 3D shape, appearance/texture, 6D pose, size/scales, and 2D masks. Given a single RGB-D observation or image, the ShAPO system 170 infers 6D pose, size, 3D shape, and appearance/texture of objects in a scene.

Determining object pose and physical properties from an RGB image is an intrinsically ill-posed problem due a variety of reasons, but most notably camera perspective ambiguity. This ambiguity can be resolved by obtaining prior knowledge about the object of interest and thereby restricting the search space. However, obtaining and acquiring such priors for real data is infeasible, and the resulting annotations would, in any case, be just approximations of real objects. Example embodiments can solve this technical problem by utilizing synthetically generated data. Rendering 3D objects realistically allows a true ground truth to be obtained, and allows for the learning of the shape priors, thus greatly constraining the pose search space.

Multi-object 3D shape reconstruction and 6D pose (i.e., 3D orientation and position) and size estimation from raw visual observations can be critical for robotics manipulation, navigation and scene understanding. The ability to perform pose estimation in real-time can lead to fast feed-back control, and the capability to reconstruct complete 3D shapes results in fine-grained understanding of local geometry, often helpful in for example robotics grasping. The present disclosure addresses the technical problem of detecting objects when their exact 3D models and sizes are not known, which is often referred to as category-level object detection. Examples of the present disclosure result in a real-time, anchor free, single shot approach for holistic object-centric 3D scene understanding from a single-view RGB-D image. The present disclosure in one example is directed to shape reconstruction with appearance and object-centric scene context for a holistic object-centric scene understanding from a single RGB-D observation.

Figure 1:
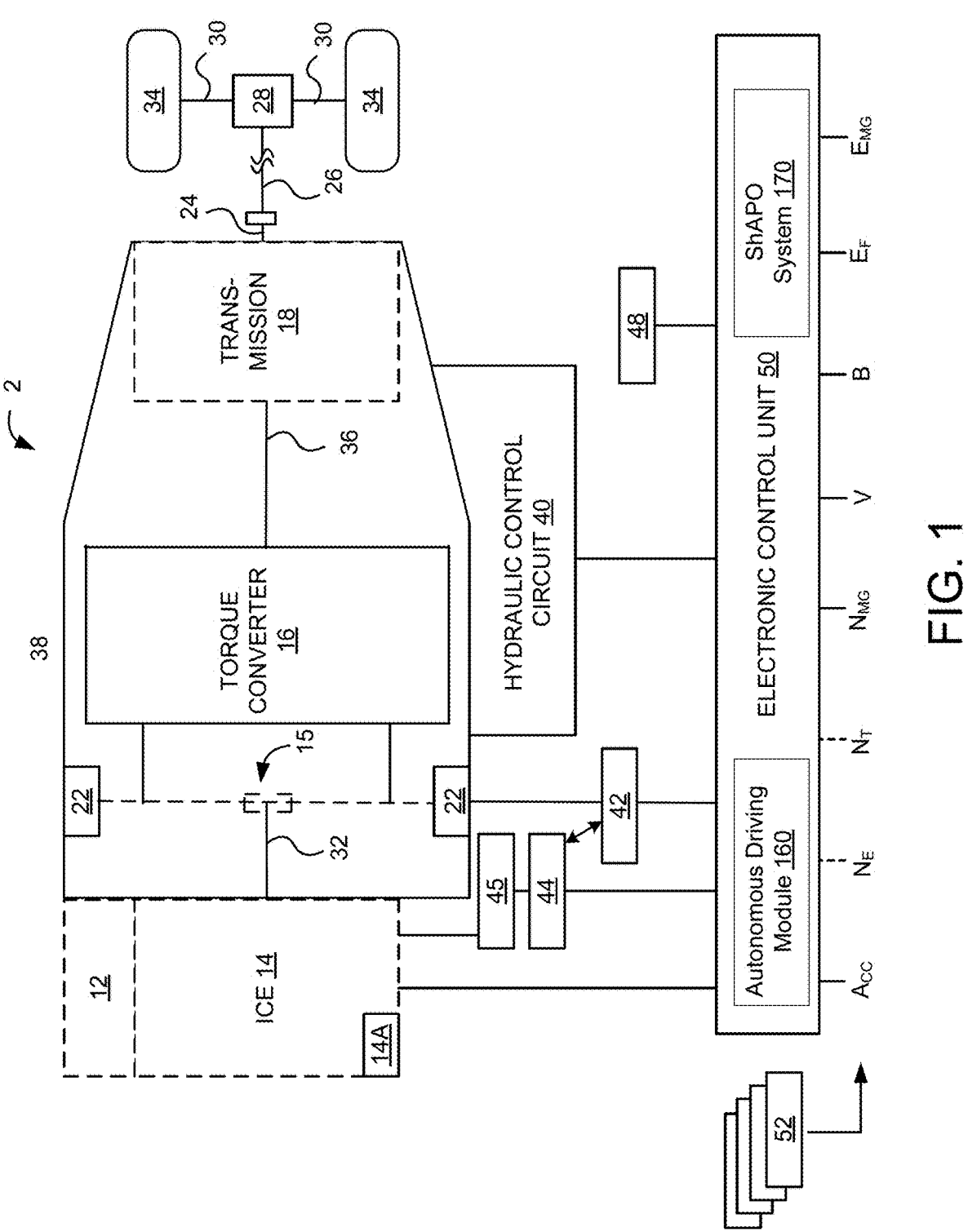
FIG. 1 illustrates an example of an all-wheel drive hybrid vehicle with which embodiments of the systems and methods disclosed herein may be implemented.

The systems and methods disclosed herein may be implemented in any of a number of robotics applications, including grasping, manipulation, and others. The systems and methods disclosed herein may also be implemented with any of a number of different vehicles and vehicle types. For example, the systems and methods disclosed herein may be used with automobiles, trucks, motorcycles, recreational vehicles and other like on-or off-road vehicles. In addition, the principals disclosed herein may also extend to other vehicle types as well. An example hybrid electric vehicle (HEV) in which embodiments of the disclosed technology may be implemented is illustrated in FIG. 1. Although the example described with reference to FIG. 1 is a hybrid type of vehicle, the systems and methods for providing implicit representations for multi-object 3D shape, appearance, size, and 6D pose optimization can be implemented in other types of vehicle including gasoline- or diesel-powered vehicles, fuel-cell vehicles, electric vehicles, or other vehicles.

FIG. 1 illustrates a drive system of a vehicle 2 that may include an internal combustion engine 14 and one or more electric motors 22 (which may also serve as generators) as sources of motive power. Driving force generated by the internal combustion engine 14 and motors 22 can be transmitted to one or more wheels 34 via a torque converter 16, a transmission 18, a differential gear device 28, and a pair of axles 30.

As an HEV, vehicle 2 may be driven/powered with either or both of engine 14 and the motor(s) 22 as the drive source for travel. For example, a first travel mode may be an engine-only travel mode that only uses internal combustion engine 14 as the source of motive power. A second travel mode may be an EV travel mode that only uses the motor(s) 22 as the source of motive power. A third travel mode may be an HEV travel mode that uses engine 14 and the motor(s) 22 as the sources of motive power. In the engine-only and HEV travel modes, vehicle 100 relies on the motive force generated at least by internal combustion engine 14, and a clutch 15 may be included to engage engine 14. In the EV travel mode, vehicle 2 is powered by the motive force generated by motor 22 while engine 14 may be stopped and clutch 15 disengaged.

Engine 14 can be an internal combustion engine such as a gasoline, diesel or similarly powered engine in which fuel is injected into and combusted in a combustion chamber. A cooling system 12 can be provided to cool the engine 14 such as, for example, by removing excess heat from engine 14. For example, cooling system 12 can be implemented to include a radiator, a water pump, and a series of cooling channels. In operation, the water pump circulates coolant through the engine 14 to absorb excess heat from the engine. The heated coolant is circulated through the radiator to remove heat from the coolant, and the cold coolant can then be recirculated through the engine. A fan may also be included to increase the cooling capacity of the radiator. The water pump, and in some instances the fan, may operate via a direct or indirect coupling to the driveshaft of engine 14. In other applications, either or both the water pump and the fan may be operated by electric current such as from battery 44.

An output control circuit 14A may be provided to control drive (output torque) of engine 14. Output control circuit 14A may include a throttle actuator to control an electronic throttle valve that controls fuel injection, an ignition device that controls ignition timing, and the like. Output control circuit 14A may execute output control of engine 14 according to a command control signal(s) supplied from an electronic control unit 50, described below. Such output control can include, for example, throttle control, fuel injection control, and ignition timing control.

Motor 22 can also be used to provide motive power in vehicle 2 and is powered electrically via a battery 44. Battery 44 may be implemented as one or more batteries or other power storage devices including, for example, lead-acid batteries, nickel-metal hydride batteries, lithium ion batteries, capacitive storage devices, and so on. Battery 44 may be charged by a battery charger 45 that receives energy from internal combustion engine 14. For example, an alternator or generator may be coupled directly or indirectly to a drive shaft of internal combustion engine 14 to generate an electrical current as a result of the operation of internal combustion engine 14. A clutch can be included to engage/disengage the battery charger 45. Battery 44 may also be charged by motor 22 such as, for example, by regenerative braking or by coasting during which time motor 22 operate as generator.

Motor 22 can be powered by battery 44 to generate a motive force to move the vehicle and adjust vehicle speed. Motor 22 can also function as a generator to generate electrical power such as, for example, when coasting or braking. Battery 44 may also be used to power other electrical or electronic systems in the vehicle. Motor 22 may be connected to battery 44 via an inverter 42. Battery 44 can include, for example, one or more batteries, capacitive storage units, or other storage reservoirs suitable for storing electrical energy that can be used to power motor 22. When battery 44 is implemented using one or more batteries, the batteries can include, for example, nickel metal hydride batteries, lithium ion batteries, lead acid batteries, nickel cadmium batteries, lithium ion polymer batteries, and other types of batteries.

An electronic control unit 50 (described below) may be included and may control the electric drive components of the vehicle as well as other vehicle components. For example, electronic control unit 50 may control inverter 42, adjust driving current supplied to motor 22, and adjust the current received from motor 22 during regenerative coasting and breaking. As a more particular example, output torque of the motor 22 can be increased or decreased by electronic control unit 50 through the inverter 42.

A torque converter 16 can be included to control the application of power from engine 14 and motor 22 to transmission 18. Torque converter 16 can include a viscous fluid coupling that transfers rotational power from the motive power source to the driveshaft via the transmission. Torque converter 16 can include a conventional torque converter or a lockup torque converter. In other embodiments, a mechanical clutch can be used in place of torque converter 16.

Clutch 15 can be included to engage and disengage engine 14 from the drivetrain of the vehicle. In the illustrated example, a crankshaft 32, which is an output member of engine 14, may be selectively coupled to the motor 22 and torque converter 16 via clutch 15. Clutch 15 can be implemented as, for example, a multiple disc type hydraulic frictional engagement device whose engagement is controlled by an actuator such as a hydraulic actuator. Clutch 15 may be controlled such that its engagement state is complete engagement, slip engagement, and complete disengagement complete disengagement, depending on the pressure applied to the clutch. For example, a torque capacity of clutch 15 may be controlled according to the hydraulic pressure supplied from a hydraulic control circuit (not illustrated). When clutch 15 is engaged, power transmission is provided in the power transmission path between the crankshaft 32 and torque converter 16. On the other hand, when clutch 15 is disengaged, motive power from engine 14 is not delivered to the torque converter 16. In a slip engagement state, clutch 15 is engaged, and motive power is provided to torque converter 16 according to a torque capacity (transmission torque) of the clutch 15.

As alluded to above, vehicle 2 may include an electronic control unit 50. Electronic control unit 50 may include circuitry to control various aspects of the vehicle operation. Electronic control unit 50 may include, for example, a microcomputer that includes a one or more processing units (e.g., microprocessors), memory storage (e.g., RAM, ROM, etc.), and I/O devices. The processing units of electronic control unit 50 execute instructions stored in memory to control one or more electrical systems or subsystems in the vehicle. Electronic control unit 50 can include a plurality of electronic control units such as, for example, an electronic engine control module, a powertrain control module, a transmission control module, a suspension control module, a body control module, and so on. As a further example, electronic control units can be included to control systems and functions such as doors and door locking, lighting, human-machine interfaces, cruise control, telematics, braking systems (e.g., ABS or ESC), battery management systems, and so on. These various control units can be implemented using two or more separate electronic control units, or using a single electronic control unit.

In example embodiments the vehicle 2 is configured to switch selectively between an autonomous mode, one or more semi-autonomous operational modes, and/or a manual mode. In example embodiments the vehicle 2 is an autonomous vehicle that operates in an autonomous mode which refers to navigating and/or maneuvering the vehicle 2 along a travel route using one or more computing systems to control the vehicle 2 with minimal or no input from a human driver. Accordingly the electronic control unit 50 of the vehicle 2 for example can include one or more autonomous driving module(s) 160. The autonomous driving module(s) 160 can be configured to receive data from the sensor system 52 and/or any other type of system capable of capturing information relating to the vehicle 2 and/or the external environment of the vehicle 2.

In example embodiments the one or more memory storage units in the ECU 50 can store map data. The map data can include maps or terrain maps of one or more geographic areas, or information or data on roads, traffic control devices, road markings, structures, features, and/or landmarks in the one or more geographic areas. The map data can be in any suitable form including aerial views of an area, ground views of an area, measurements, dimensions, distances, elevational data, and/or information for one or more items included in the map data and/or relative to other items included in the map data. The map data can include a digital map with information about road geometry.

In the example illustrated in FIG. 1, electronic control unit 50 receives information from a plurality of sensors 52 included in vehicle 2. For example, electronic control unit 50 may receive signals that indicate vehicle operating conditions or characteristics, or signals that can be used to derive vehicle operating conditions or characteristics. These may include, but are not limited to accelerator operation amount, $A_{CC}$, a revolution speed, $N_E$, of internal combustion engine 14 (engine RPM), a rotational speed, $N_{MG}$, of the motor 22 (motor rotational speed), and vehicle speed, $N_V$. These may also include torque converter 16 output, $N_T$ (e.g., output amps indicative of motor output), brake operation amount/pressure, B, and battery SOC (i.e., the charged amount for battery 44 detected by an SOC sensor). Accordingly, vehicle 2 can include a plurality of sensors 52 that can be used to detect various conditions internal or external to the vehicle and provide sensed conditions to engine control unit 50 (which, again, may be implemented as one or a plurality of individual control circuits). In one embodiment, sensors 52 may be included to detect one or more conditions directly or indirectly such as, for example, fuel efficiency, $E_F$, motor efficiency, $E_{MG}$, hybrid (internal combustion engine 14+MG 12) efficiency, acceleration, $A_{CC}$, etc.

In example embodiments the vehicle sensor(s) 52 can detect, determine, and/or sense information about the vehicle 2 itself, or can be configured to detect, and/or sense position and orientation changes of the vehicle 2, such as, for example, based on inertial acceleration. In example embodiments the vehicle sensor(s) 52 can include one or more accelerometers, one or more gyroscopes, an inertial measurement unit (IMU), a dead-reckoning system, a global navigation satellite system (GNSS), a global positioning system (GPS), a navigation system, and/or other suitable sensors including a speedometer to determine a current speed of the vehicle 2.

In some embodiments, one or more of the sensors 52 may include their own processing capability to compute the results for additional information that can be provided to electronic control unit 50. In other embodiments, one or more sensors may be data-gathering-only sensors that provide only raw data to electronic control unit 50. In further embodiments, hybrid sensors may be included that provide a combination of raw data and processed data to electronic control unit 50. Sensors 52 may provide an analog output or a digital output.

Sensors 52 may be included to detect not only vehicle conditions but also to detect external conditions as well. Sensors that might be used to detect external conditions can include, for example, sonar, radar, lidar or other vehicle proximity sensors, and cameras or other image sensors. Image sensors can be used to detect, for example, traffic signs indicating a current speed limit, road curvature, obstacles, and so on. Still other sensors may include those that can detect road grade. While some sensors can be used to actively detect passive environmental objects, other sensors can be included and used to detect active objects such as those objects used to implement smart roadways that may actively transmit and/or receive data or other information.

The example of FIG. 1 is provided for illustration purposes only as one example of vehicle systems with which embodiments of the disclosed technology may be implemented. One of ordinary skill in the art reading this description will understand how the disclosed embodiments can be implemented with this and other vehicle platforms.

Moreover, while arrangements will be described herein with respect to vehicles, it will be understood that embodiments are not limited to vehicles or to autonomous navigation of vehicles but may include for example robotics manipulation, augmented reality, and scene understanding, among others. In some implementations, the vehicle 2 may be any robotic device or form of motorized transport that, for example, includes sensors to perceive aspects of the surrounding environment, and thus benefits from the functionality discussed herein associated with improving 3D shape reconstruction and 6D pose, appearance, and size estimation and optimization. Furthermore, while the various elements are shown as being located within the vehicle 2 in FIG. 1, it will be understood that one or more of these elements can be located external to the vehicle 2. Further, the elements shown may be physically separated by large distances. For example, as discussed, one or more components of the disclosed system can be implemented within the vehicle 2 while further components of the system are implemented within a cloud-computing environment or other system that is remote from the vehicle 2.

Figure 2:
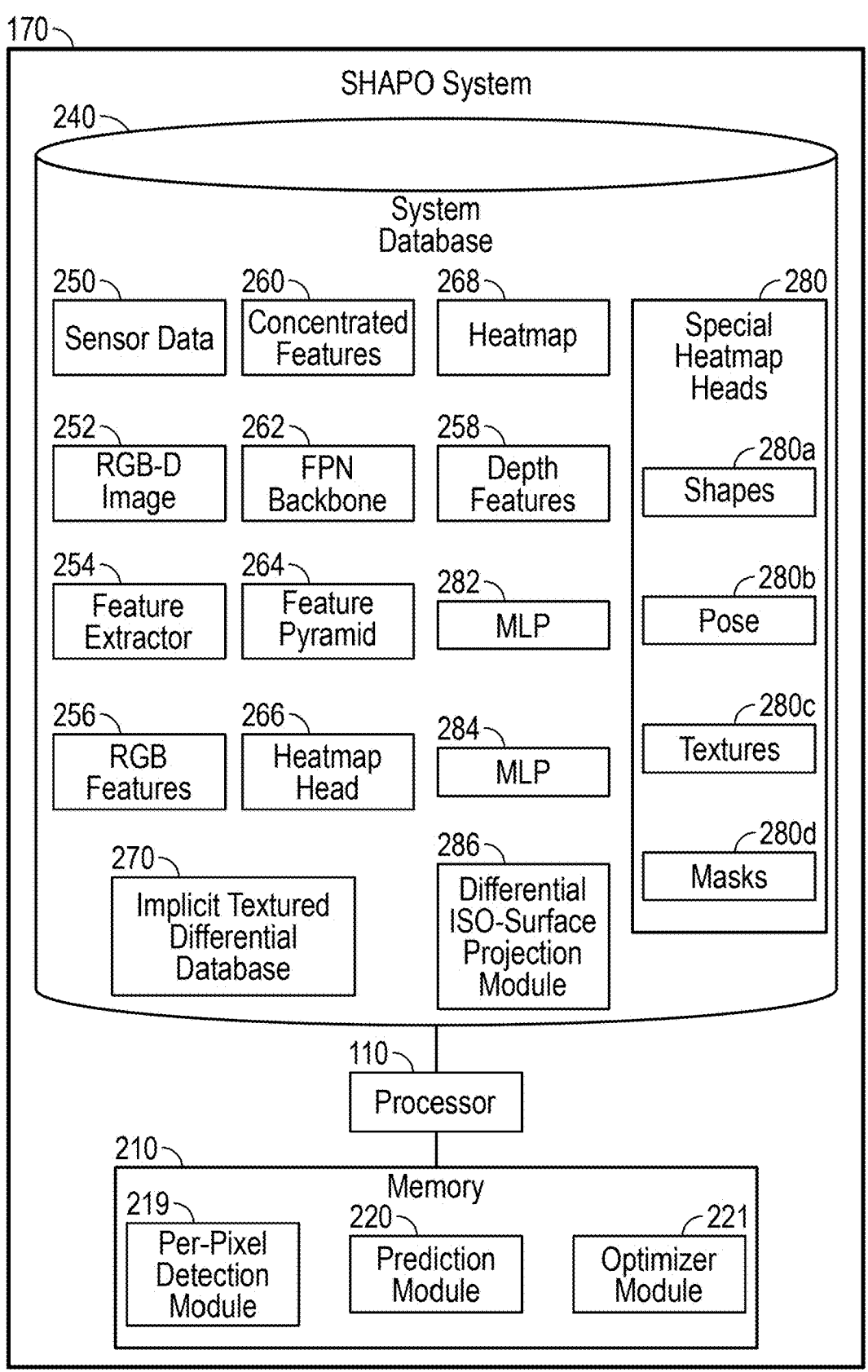
FIG. 2 illustrates an example architecture for predicting and optimizing shape, appearance, pose, size, and masks of an RGB-D image, in accordance with one embodiment of the systems and methods described herein.

FIG. 2 illustrates an example architecture for predicting and optimizing shape, appearance, pose, and size of an RGB-D image, in accordance with one embodiment of the systems and methods described herein. Referring now to FIG. 2, in this example, ShAPO system 170 includes a per-pixel detection module 219, a prediction module 220, and an optimizer module 221. The ShAPO system 170 can receive sensor data 250 from one or more sensors 52. The ShAPO system 170 can be implemented as an ECU or as part of an ECU such as, for example electronic control unit 50 as shown in FIG. 1. In other embodiments, the ShAPO system 170 can be implemented independently of the electronic control unit 50.

The ShAPO system 170, in various embodiments, can be implemented partially within a vehicle such as the vehicle 2 of FIG. 1 or within a robotics device having sensors for perceiving various conditions, or as a cloud-based service. For example, in one approach, functionality associated with at least one module of the ShAPO system 170 is implemented within the vehicle 2 while further functionality is implemented within a cloud-based computing system.

Figure 3A:
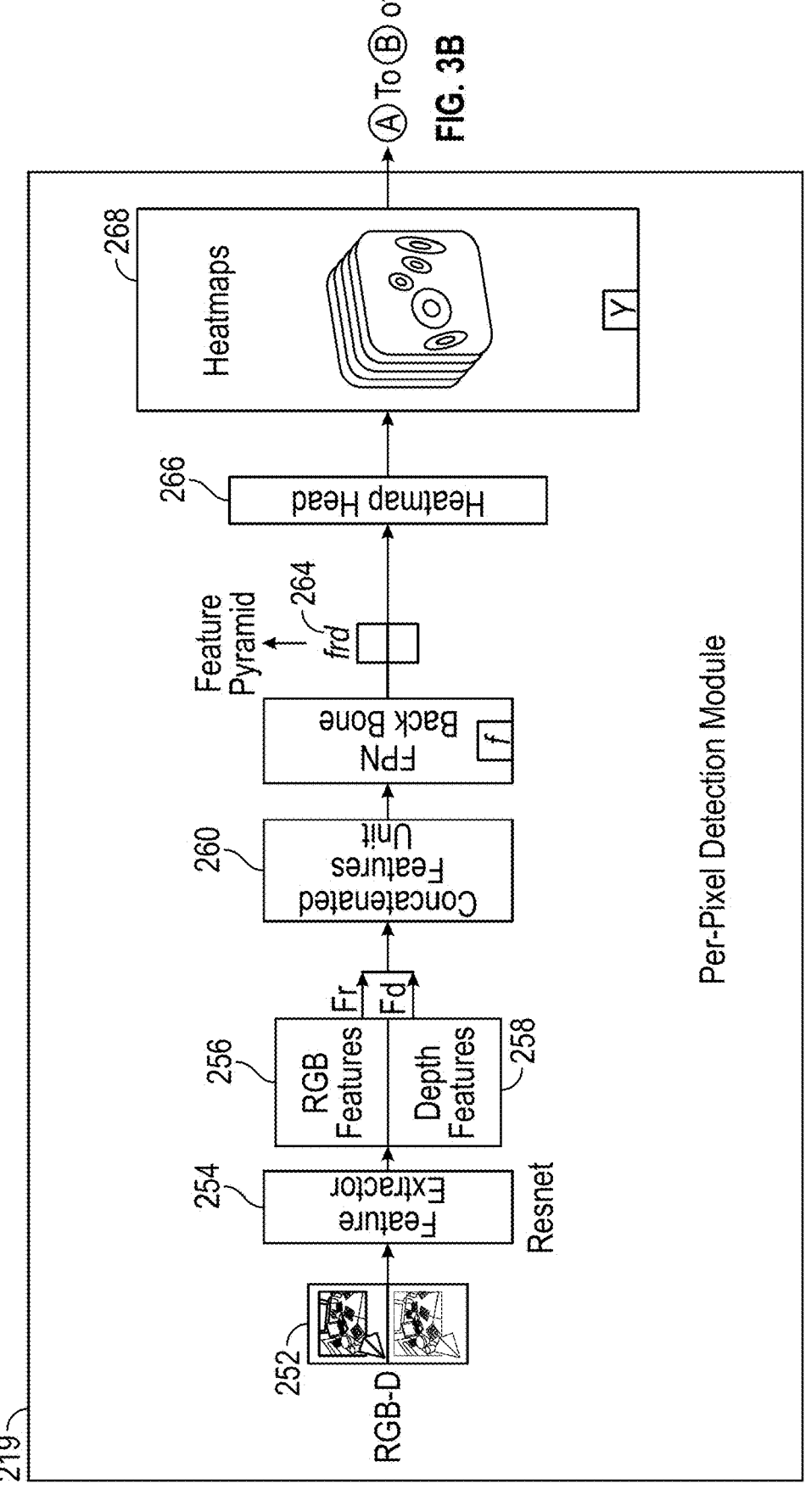
FIG. 3, which includes FIGS. 3A and 3B, provides a high level overview of the processes performed by the system in FIG. 2.
Figure 3B:
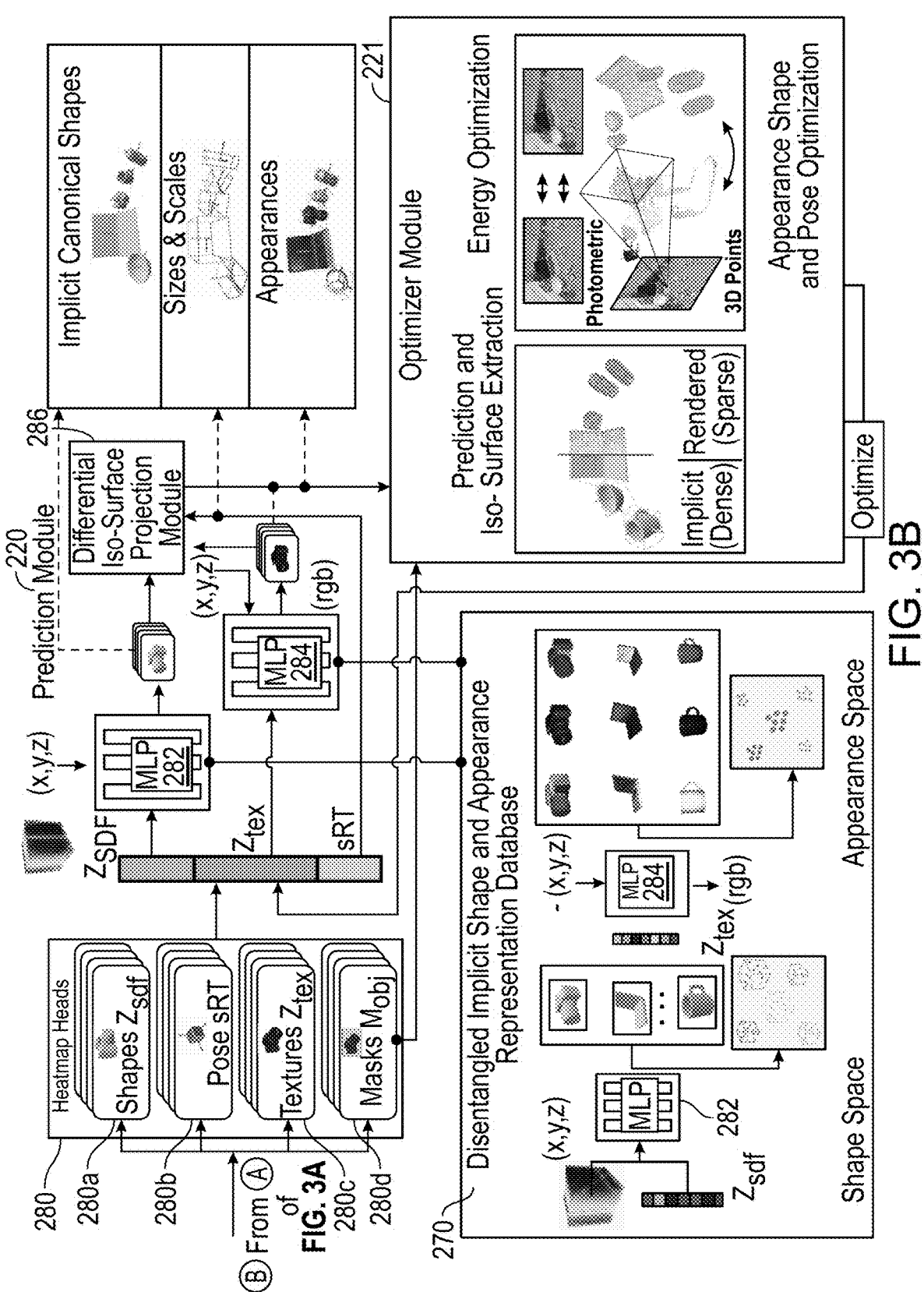

With reference to FIGS. 2, 3A, and 3B, examples of the ShAPO system 170 of FIG. 1 are further illustrated. The ShAPO system 170 is shown as including a processor 110 which may be a processor located in electronic control unit 50 from the vehicle 2 of FIG. 1, or in a robotics device having sensors for perceiving various conditions, or in other suitable environments. Accordingly, the processor 110 may be a part of the ShAPO system 170, the ShAPO system 170 may include a separate processor from the processor 110 of the vehicle 2, or the ShAPO system 170 may access the processor 110 through a data bus or another communication path.

In one embodiment, the ShAPO system 170 includes a memory 210 (which may be a memory located in the electronic control unit 50 of FIG. 1) that stores a per-pixel detection module 219, a prediction module 220, and an optimizer module 221. The memory 210 may be a random-access memory (RAM), read-only memory (ROM), a hard-disk drive, a flash memory, or other suitable memory for storing the modules 219-221. The modules 219-221 may be, for example, computer-readable instructions that when executed by one or more processors such as the processor 110 cause the processor 110 to perform the various functions disclosed herein.

Processor 110 can include one or more GPUs, CPUs, microprocessors, or any other suitable processing system. Processor 110 may include a single core or multicore processors. The memory 210 may include one or more various forms of memory or data storage (e.g., flash, RAM, etc.) that may be used to store the calibration parameters, images (analysis or historic), point parameters, instructions and variables for processor 110 as well as any other suitable information. Memory 210, can be made up of one or more modules of one or more different types of memory, and may be configured to store data and other information as well as operational instructions that may be used by the processor 110 to modules 219-221.

With reference to FIG. 2, the modules 219-221 generally include instructions that function to control the processor 110 to receive data inputs. The data inputs may be from one or more sensors (e.g., sensors 52 of the vehicle 2). The inputs are, in one embodiment, observations of one or more objects in an environment proximate to the vehicle 2 and/or other aspects about the surroundings. As provided for herein, the per-pixel detection module 219 acquires sensor data 250 that includes RGB-D images. It is noted that in an example embodiment the per-pixel detection module 219 predicts a Gaussian heat map, but the disclosed technology is not limited thereto.

In addition to locations of surrounding vehicles, the sensor data 250 may also include, for example, information about lane markings, and so on. Moreover, the per-pixel detection module 219, in one embodiment, controls the sensors 52 to acquire the sensor data 250 about an area that encompasses 360 degrees about the vehicle 2 in order to provide a comprehensive assessment of the surrounding environment. Of course, in alternative embodiments, the per-pixel detection module 219 may acquire the sensor data 250 about a forward direction alone when, for example, the vehicle 2 is not equipped with further sensors to include additional regions about the vehicle and/or the additional regions are not scanned due to other reasons (e.g., unnecessary due to known current conditions).

As noted above the ShAPO system 170 of FIGS. 1-3 carries out processes including detecting objects, predicting shape, appearance, pose, and size of objects, and optimizing shape, pose and appearance using segmentation masks and novel single-view observation, in accordance with example embodiments of the application.

In example embodiments both shape and appearance of objects are recovered from a single RGB-D observation. Further optimization allows to improve the quality of both shape/appearance reconstruction as well as the object's pose. In more detail, given a single-view RGB-D observation ($I \in R^{h_0 \times w_0 \times 3}$, $D \in R^{h_0 \times w_0}$) as an input, the ShAPO system 170 infers the complete 3D information of multiple objects including the shape, appearance (textures), pose, and size (scales) of all objects in a scene. The ShAPO system 170 represents object instances along with their complete 3D information by obtaining shape, appearance, pose, and size codes. The ShAPO system 170 also represents corresponding 2D masks through their 2D location in the spatial RGB image. In one example an end-to-end trainable method is employed.

In an example embodiment there are three main stages of this process, referred to herein as Stages I, II, and III. Thee three stages will be first summarized and then described in more detail below.

Brief Summary of Stages I, II, and III

Stage I: Stage I may be performed in an example embodiment by the per-pixel detection module 219, and includes detecting an object or objects by using, for example, a Gaussian heat map. In an example this is a single-shot detection and 3D prediction module that detects multiple objects based on their center points in the 2D spatial grid and recovers their 3D shapes and 6D pos and sizes from partial observations.

Stage II: Stage II may be performed in an example embodiment by the prediction module 220, and includes predicting or estimating shape, texture, and 6D pose and size codes, along with 2D masks, which involves training using specialized heads. The learning is from CAD modules comprising an implicit joint differentiable database of shape and appearance priors. Joint and implicit shape codes and texture codes are obtained using trained multi-layer perceptrons (MLPs). In particular, shape codes and texture codes are obtained using an implicit joint differentiable database of shape and appearance priors which is used to embed objects in a unique space, representing shapes as a zero-level set of implicit signed distance fields (SDFs) and appearance as continuous texture fields (TF). Differential iso-surface projection is used as explained below. SDF defines distances to the closest surface in the unit cube to construct shape. In an example embodiment the prediction module 220 predicts the following quantities: masks, 6D pose and size (rotation, translation, and scale), shape code, and appearance code.

In example embodiments the prediction module 220 includes the heatmap heads 280 (i.e., 280a-d), the MLPs 282, 284, and the differential iso-surface projection module 286, and may include the disentangled implicit shape and appearance representation database; of course, these components (as well as components associated with the per-pixel detection module 219 and the optimizer module 221) may be local or remote, can include or be associated with one or more processing resources, may be implemented using one or more processors and memories, etc.

Stage III may be performed in an example embodiment by the optimizer module 221, and is a 2D/3D refinement method that includes jointly optimizing for shape, texture, pose, size, and mask predictions using the same implicit joint differentiable database of shape and appearance priors. The refinement uses an Octree-based coarse-to-fine differentiable optimization to improve shape, appearance, pose, and size predictions iteratively.

Detailed description of Stages I, III, and III

Stages I-III are described below with particular reference to FIGS. 2-3. As noted above Stage I comprises detecting an object or objects using a heat map such as a Gaussian heat map. In an example the processes of Stage I may be performed by the per-pixel detection module 219 which is a single-shot detection and 3D prediction module that detects multiple objects based on their center points in the 2D spatial grid and recovers their complete 3D shapes, 6D pose, and sizes from partial observations. Accordingly, in examples of the present disclosure, object detection is first formulated as a spatial per-pixel point detection.

In general, the per-pixel detection module 219 is configured to detect objects in an RGB-D image in a per-pixel manner using a feature pyramid detection backbone that is based on feature pyramid networks. The pre-pixel detection module 219 is configured to simultaneously detect, reconstruct, and localize objects in a 3D space given an RGB-D image as input. In the per-pixel detection module 219, complete 3D information of each object is represented by a center point of each object in a 2D spatial image.

Figure 5:
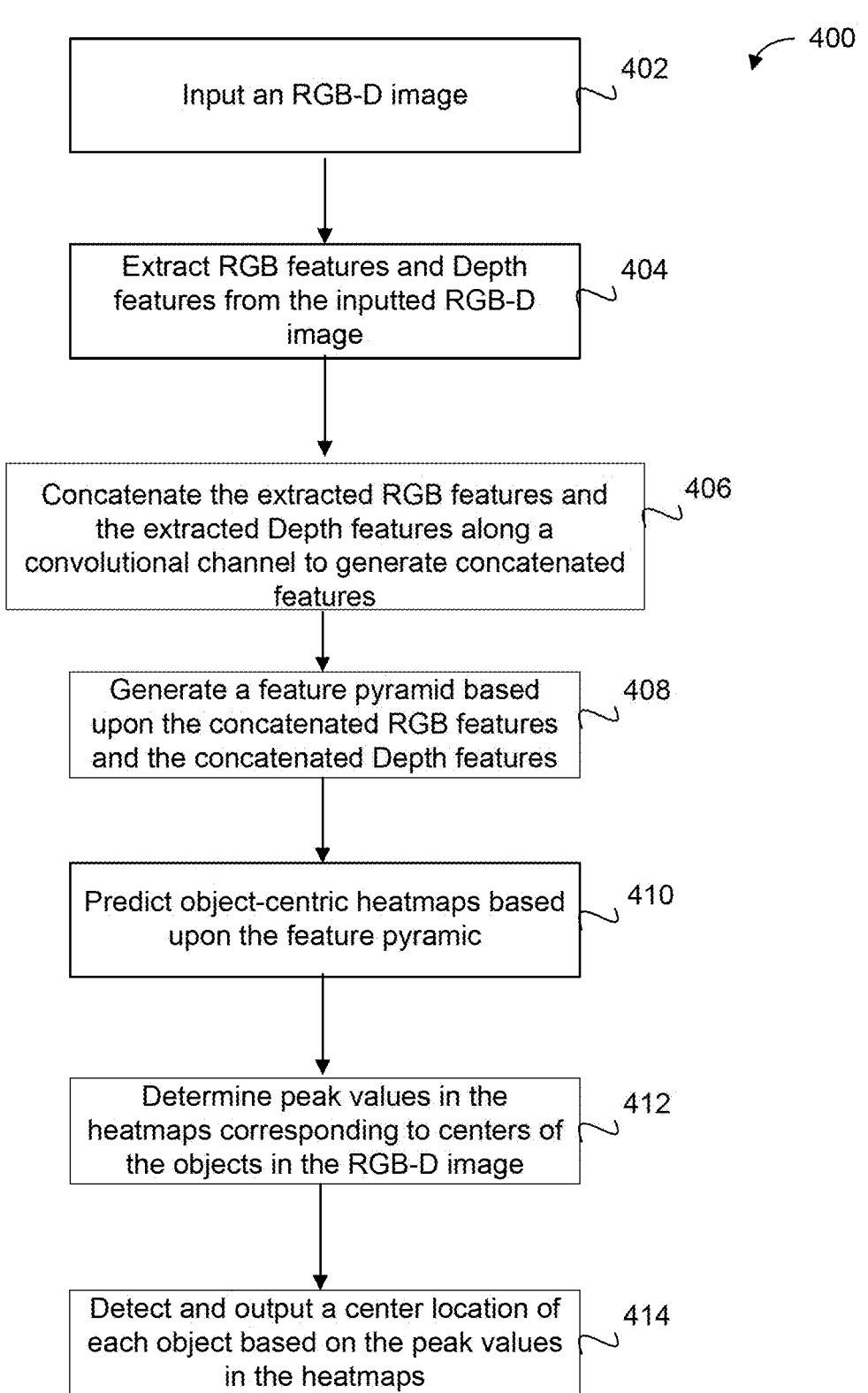
FIG. 5 shows processes performed by a per-pixel detection module, according to an example embodiment.

FIG. 5 shows a process of Stage I in more detail, according to an example embodiment. In Step 402 a single-view RGB-D observation is given as an input. In particular the system database 240 of FIG. 2 includes an RGB-D image 252. In one non-limiting example, the RGB-D image 252 is captured by an RGB-D camera of a vehicle such as the vehicle 2 of FIG. 1 or a robotics device or the like. The RGB-D image 252 may include multiple objects, and the multiple objects may be of the same or different types. The RGB-D image 252 comprises an RGB component and a Depth component. In an example, the RGB-D image 252 includes vehicles that surround the vehicle 2.

Stated more formally, the input is an RGB-D observation or image 252 ($I \in R^{h_0 \times w_0 \times 3}$, $D \in R^{h_0 \times w_0}$), where I is an RGB component of the RGB-D image 252, D is a depth component of the RGB-D image 252, $w_0$ is the width, and $h_0$ is the height. The per-pixel detection module 219 infers shape and appearance codes along with the 2D masks and 6D poses ($\hat{P} \in SE(3)$) and scales ($\hat{s} \in R^3$) for each object in the RGB-D image. The 6D pose $\hat{P} \in SE(3)$ of each object is denoted by a 3D rotation $\hat{R} \in SO(3)$ and a translation $\hat{t} \in R^3$. The 6D pose, along with 3D size and 1D scales $\hat{s}$ completely define each object instance in 3D space with respect to a camera coordinate frame.

The per-pixel detection module 219 in an example embodiment predicts object-centric Gaussian heat maps $$\hat{Y} \in [0, 1][0, 1]^{\frac{h_0}{R} \times \frac{w_0}{R} \times 1}$$

where each detected point $\hat{x}_i$, $\hat{y}_i$) denotes the local maxima in the heatmap ($\hat{Y}$). Here R denotes the heatmap down-sampling factor, e.g., 8 in one example. To predict these heatmaps, an FPN backbone 262 is utilized (i.e., a feature backbone that is based on feature pyramid networks (FPNs)), along with a specialized heatmap prediction head 266, as further described below.

Step 404 of FIG. 5 includes extracting RGB features and Depth features from the RGB-D image. The system database 240 further includes a feature extractor 254, RGB features 256, and Depth features 258. According to embodiments, the feature extractor 254 comprises a residual neural network (ResNet) that has a first stem and a second stem, where the first stem extracts the RGB features 256 from the RGB-D image 252 and the second stem extracts the Depth features 258 from the RGB-D image 252.

The per-pixel detection module 219 generates, by way of the feature extractor 254, the RGB features 256 ($f_r \in R^{h_0/4 \times w_0/4 \times C_s}$) and the depth features 258 ($f_d \in R^{h_0/4 \times w_0/4 \times C_s}$), where $C_s$ is a number of convolutional channels such as 32. For example, the per-pixel detection module 219 provides the RGB-D image 252 as an input to the feature extractor 254 and obtains the RGB features 256 ($f_r$) and the Depth features 258 ($f_d$) as outputs of the feature extractor 254. In general, the RGB features 256 and the Depth features 258 are low-resolution spatial feature representations of the RGB-D image 252.

Step 406 includes concatenating the RGB features and the Depth features along a convolutional channel to generate concatenated features. According to embodiments, the per-pixel detection module 219 concatenates the RGB features 256 ($f_r$) and the depth features 258 ($f_d$) along a convolutional channel dimension to generate the concatenated features 260.

Step 408 includes generating a feature pyramid based upon the concatenated RGB features and the concatenated Depth features. According to embodiments, the FPN backbone 262 is configured to generate the feature pyramid 264 based upon the concatenated features 260 (which are based upon the RGB features 256 and the Depth features 258). According to embodiments, the per-pixel detection module 219 provides the concatenated features 260 as an input to the FPN backbone 262 and obtains the feature pyramid 264 ($f_{rd}$) as an output of the FPN backbone 262. According to embodiments, the feature pyramid 264 has scales ranging from $\frac{1}{8}$ to $\frac{1}{2}$ resolution, where each level of the feature pyramid 264 has the same channel dimension, such as sixty-four.

Step 410 includes predicting object-centric heatmaps, which may for example be Gaussian heatmaps (Y), based upon the feature pyramid, to output detected objects, Step 412 includes determining peak values in the heatmaps (Y) based upon the feature pyramid, and Step 414 includes detecting and outputting a center location of each object based on the peak values in the heatmaps (Y). Steps 410-414 are described in more detail as follows.

The per-pixel detection module 219 predicts, by way of the heatmap head 266, object-centric heatmaps 268

$$\left( \hat{Y} \in [0, 1]^{\frac{h_0}{R} \times \frac{w_0}{R} \times 1} \right)$$

based upon the feature pyramid 264, where each detected point ($\hat{x}_i$, $\hat{y}_i$) denotes the local maxima in the heatmap ($\hat{Y}$). Here, R denotes a heatmap down-sampling factor, e.g., 8 in one example. For example, the per-pixel detection module 219 provides the feature pyramid 264 as an input to the heatmap head 266 and obtains the heatmaps 268 as an output of the heatmap head 266. The heatmap head 266 comprises a convolutional neural network (CNN). The heatmaps 268 comprise values, where some values represent peaks and some values represent non-peaks. The peaks in the heatmaps 268 correspond to centers of the objects in the RGB-D image 252.

In general, the heatmap head 266 merges semantic information from each level of the feature pyramid 264 into one output ($\hat{Y}$), that is, the heatmaps 268. The heatmaps 268 capture multi-scale information and encode features at higher resolution for effective reasoning at a per-pixel level. According to embodiments, the per-pixel detection module 219 generates the heatmaps 268 by performing three upsampling steps on the feature pyramid 264, followed by an element-wise sum and, followed by applying a softmax function. According to embodiments, the network (e.g., the heatmap head 266) is trained to predict ground truth heatmaps (Y) by minimizing mean squared error (MSE) loss ($L_{inst}$) over all pixels (x, y) in the heatmaps 268 according to equation (1) below:

$$L_{inst} = \sum_{xyg} (\hat{Y} - Y)^2 \tag{1}$$

According to embodiments, the per-pixel detection module 219 engages in a training process to compute the target or ground truth heatmaps (Y). During training, the target heatmaps (Y) are found by "splatting" ground-truth center-points ($x_i$, $y_i$) (c in $R^2$) for all objects in the RGB-D image 252 using the gaussian kernel $N(x_i, y_i, \sigma_i)$, where $\sigma_i$ is relative to the spatial extent of each object as defined by the corresponding ground truth bounding box annotation.

At a high level Stage II includes inputting the detected objects from the heatmaps (Y). Stage II further includes predicting shape, appearance, pose, and size codes along with 2D masks for detected object centers using specialized heads, an implicit joint differential database of shape and appearance priors, and a corresponding zero iso-surface-based differentiable rendering or projection model. Stage II further includes training multi-layer perceptrons (MLPs) to learn shape and appearance/texture, and during training outputting from the specialized heads the shape, appearance, pose, size, and 2D masks at each pixel. Stage II further includes using the outputted codes to transform the object shape from a canonical frame to the 3D world.

FIG. 6 shows the process of Stages II and III in more detail, according to an example embodiment. The processes of Stages II and III may be performed for example by the prediction module 220 and the optimizer module 221.

Step 602 of FIG. 6 includes inputting into heatmap heads a center location of each detected object from the heatmaps which may be Gaussian heatmaps. Step 604 includes sampling, from an output of each heatmap head, shape, appearance, and 6D pose and size codes, and 2D masks. Step 606 includes outputting sampled shape and appearance codes from respective heatmap heads into respective shape and appearance MLPs, outputting 6D pose and size codes into a differential iso-surface projection engine or module 286, and outputting 2D masks into an optimizer, wherein the sampled codes and 2D masks serve as initial estimates of each code and 2D mask. Steps 602-606 are now described in more detail below.

As noted above Stage II includes predicting or estimating shape, texture, pose, size, and 2D masks. Once the network detects objects, represented by the heatmaps (Y) 268 from Stage I, it then predicts their complete 3D information (i.e., 3D shape, 6D pose, and size along with the 3D appearance) in a single-forward pass using specialized heads.

Stated more formally, the prediction module 220 predicts an object's complete 3D information (i.e., 3D shape, 6D pose, 3D appearance, and size) in a single-forward pass using the task-specific specialized heads 280a-c ($f_{\theta_{sdf}}$, $f_{\theta_p}$, and $f_{\theta_{tex}}$) with outputs $$\left(Y_{sdf} \in R^{\frac{h_0}{R} \times \frac{w_0}{R} \times 64}, Y_P \in R^{\frac{h_0}{R} \times \frac{w_0}{R} \times 13} \text{ and } Y_{tex} \in R^{\frac{h_0}{R} \times \frac{w_0}{R} \times 64}\right)$$

respectively). During training, the specialized heads 280a-c output shape codes $z_{sdf}$, appearance codes $z_{tex}$, and 6D pose codes $\tilde{P} \in SE(3)$, including size or scale codes $\hat{s} \in R^3$ at each pixel in the down-sampled map $$\left(\frac{h_0}{R} \times \frac{w_0}{R}\right).$$

The 6D pose codes outputted from specialized head 280b includes size or scale codes and predicts rotation, translation, and scale (sRT). As shown in the example embodiment of FIG. 3B the sRT may be output to the differential iso-surface projection module 286. For each object's pose ($\tilde{P}$) with respect to the camera coordinate frame, the following are regressed: a 3D rotation $\hat{R} \in SO(3)$, a 3D translation $\hat{t} \in R^3$, and 1D scales $\hat{s}$(totaling thirteen numbers in this example). These parameters are used to transform the object shape from a canonical frame to the 3D world. A 9D rotation $R\hat{} \in SO(3)$ representation is selected in this example because the neural network can better fit a continuous representation, and to avoid discontinuities with lower rotation dimensions. A rotation mapping function is employed to prevent or reduce ambiguities caused by rotational symmetries. The rotation mapping function is used only for symmetric objects (e.g., bottle, bowl, and can) in the database 270 during training and it maps ambiguous ground-truth rotations to a single canonical rotation by normalizing the pose rotation.

As noted above the prediction module 220 also predicts object instance 2D masks ($\hat{M}$) using a specialized head 280d ($f_{\theta_m}$) to output $\hat{M} \in R^{h_0 \times w_0}$, similar to a sematic segmentation head. Accurate mask prediction can be critical to accurate downstream optimization in Stage III.

Step 608 includes training the respective shape and appearance MLPs using shape and appearance priors from an implicit joint differentiable database and using an RGB loss minimizing function, to obtain further shape and appearance codes of the detected objects, wherein the database represents shapes as Signed Distance Fields (SDF) and appearance as Texture Fields (TF). Step 610 includes inputting the further shape and appearance codes into the differential iso-surface projection module 286. Step 612 includes, during training of the MLPs, outputting from the differential iso-surface projection module 286 into the optimizer module 221 the latest shape, appearance, pose and size codes, and 2D masks. Steps 608-612 will now be described in more detail, in conjunction with the implicit textured differentiable database 270 of priors.

3.3 Implicit Textured Differentiable Database 270 of Priors

As noted above, in examples, during training, ground-truth shape codes $z_{sdf}$ and appearance codes $z_{tex}$ for each object are obtained from an implicit textured differentiable representation in the database 270. in examples the prediction module 220 uses a joint implicit textured representation to learn from a large variety of CAD models stored in database 270 and embed objects in a unique and concise space, as described above in connection with Stage II. This representation is used to predict or estimate the shape, appearance, pose, size, and 2D masks in Stage II. The representation is also used as a strong inductive prior, in order to efficiently optimize in Stage III the shape, appearance, pose, size, and mask of objects in a differentiable manner. In the implicit textured database 270 of shape and appearance priors, each object shape is represented as a Signed Distance Field (SDF) where a neural network learns a signed distance function $G(x, z_{sdf})=s:z_{sdf} \in R^{64}$, $s \in R$ for every 3D point $x \in R^3$ and the appearance is represented as Texture Fields ($t_\theta:R^3 \rightarrow R^3$), which maps a 3D point $x \in R^3$ to an RGB value $c \in R^3$. Since the mapping between coordinates and colors is ambiguous without shape information, the prediction module 220, and specifically the MLP, learns a texture field only at the predicted shape, i.e., $t_\theta(x, z_{sdf}, z_{tex})=c$, $z_{tex} \in R^{64}$. The SDF function (G) implicitly defines the surface of each object shape by the zero-level set $G(.)=0$.

In more detail, to learn a shape-code ($z_{sdf}$) and a texture code ($z_{tex}$) for each object instance, a single multi-layer perceptron (MLP 282) is designed for shape (to reason about the different geometries in the database 270) and another respective MLP 282 is designed for texture (to predict color information given shape and texture codes). Through conditioning each MLP output on the latent vector, the prediction module 220 enables the modeling of multiple geometries and appearances using a single network for shape and another single network for appearance, respectively. Each MLP 282, 284 is trained separately using the supervised ground-truth reconstruction loss $L_{SDF}$ and $L_{RGB}$ as follows:

$$L_{SDF}=|\text{clamp}(G(x, z_{sdf}), \delta)-\text{clamp}(s_{gt}, \delta)|+L_{contrastive} \quad (z_{sdf}) \tag{2}$$

$$L_{RGB} = \sum_{n=1}^{N} \|c_{gt} - t_\theta(z_{sdf}, z_{tex})\|_2^2, \tag{3}$$

where $L_{SDF}$ is a combination of a clipped $L_1$ loss between ground-truth signed-distance values $s_{gt}$ and predicted SDF $G(x, z_{sdf})$ and a contrastive loss $L_{contrastive}=[m_{pos}-s_p]_++[s_n-m_{neg}]_+$. As shown by the latent shape code $(x, z_{sdf})$, the contrastive loss helps with good disentangling of the shape space, and leads to better downstream regression in the single-shot model (3.2). Once the implicit shape auto-decoder (MLP 282) is trained, the learned shape space $z_{sdf}$ is used to minimize the color loss $L_{RGB}$ which is defined as an MSE loss between predicted color at the surface $t_θ(x, z_{sdf}, z_{tex})$ and ground-truth color $c_{gt}$.

3D textured models are used from a CAD model repository (one example is Shapenet, which is publicly available and contains textured 3D models of shapes) to learn the database 270 of shape and texture priors. Once trained, the MLPs 282, 284 for both shape and appearance, respectively, find a disentangled space for color and geometry while keeping semantically similar objects together. This provides strong priors to be used for 2D and 3D optimization in Stage III.

Step 614 includes using a combined loss minimizing function and an Octree-based coarse-to-fine differentiable optimization to jointly optimize the latest shape, appearance, pose and size, and 2D masks using the database. Step 614 includes recovering an object surface from the latest shape codes to a desired resolution level using the differential iso-surface projection module 286. Steps 612-614 will now be described in detail below.

As noted above Stage III is a 2D/3D refinement method that includes jointly optimizing for shape, texture, pose, size, and mask predictions of unseen object instances using the same implicit textured differentiable database 270 noted above. This is done to refine the prediction of accurate shapes, textures, poses, and sizes of unseen object instances. The refinement uses an Octree-based coarse-to-fine differentiable optimization to improve shape, appearance, pose, and size predictions iteratively. In an example embodiment the steps of Stage III are performed by the optimizer module 221.

Specifically, during training of the MLPs 282, 284, the optimizer module 221 jointly optimizes for shape, appearance, pose, size, and mask prediction. For example, the optimizer module 221 minimizes the masked $L_1$ loss for shape, appearance, and pose prediction, denoted as $L_{sdf}, L_{tex}, L_p$, and a pixel-wise cross-entropy loss for mask prediction $$L_M = \sum_{i=1}^{h_o w_o} - \log \hat{M}_i(\hat{M}_i^{gt})$$

where $$M_i^{gt}$$

denotes the ground truth category label for each pixel.

During training of the MLPs 282, 284, the optimizer module 221 minimizes a combination of these losses as follows:

$$L=λ_{ins}L_{inst}+λ_{sdf}L_{sdf}+λ_{tex}L_{tex}+λ_M L_M+λ_p L_p \quad (2)$$

In above equation (2), $λ$ is a weighting coefficient with values determined empirically as 100, 1.0 and 1.0 and 1.0 respectively.

For shape, appearance, and pose predictions, the optimizer module 221 enforces the $L_1$ loss based on the probability estimates of the heatmaps (Y); in one example the loss is only applied where Y has a score greater than 3, to prevent or reduce ambiguity in the space where no object exists. Shape and appearance representation is next described.

Differentiable Optimization

As noted above, a key component of the ShAPO system 170 is the optimization scheme of Stage III allowing to refine initial object predictions with respect to the shape, appearance, and 6D pose and scale/size. This is a new differentiable and fast optimization method. Instead of using mesh-based representations, the optimizer module 221 relies entirely on implicit surfaces, which not only helps to avoid common connectivity and intersection problems, but also provides full control over sampling density.

Surface Projection

Figure 4:
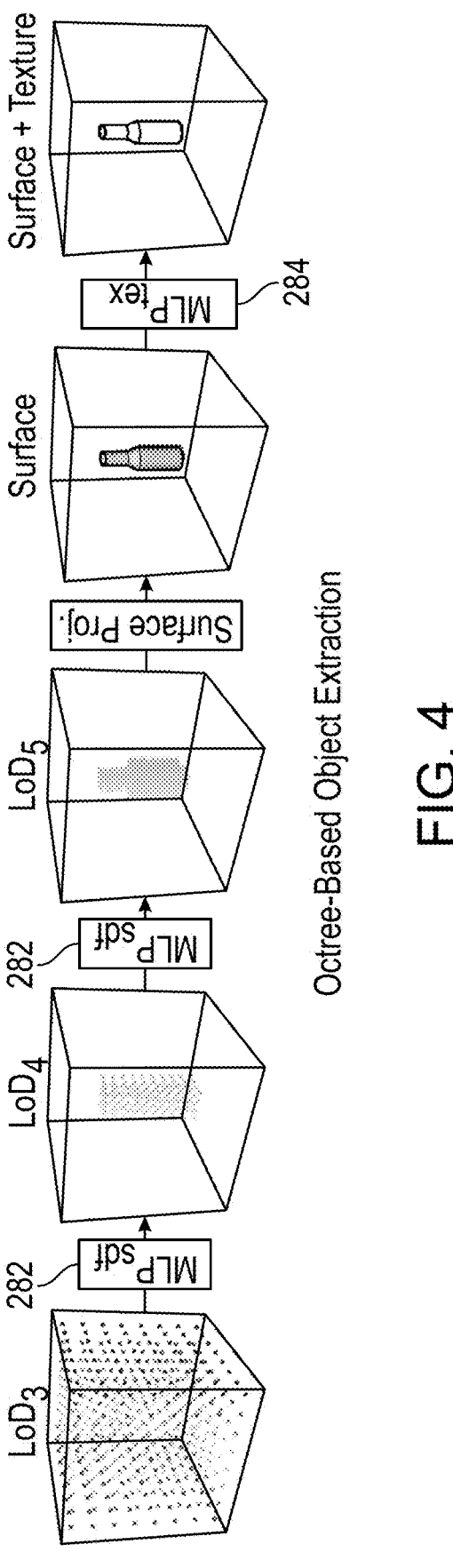
FIG. 4 shows an example of Octree-based object extraction.

Given input grid points $x_i$ and estimated SDF values $s_i$, the optimizer module 221 aims to find a differentiable transformation to extract the object surface encoded in $z_{sdf}$. A trivial solution would be to simply take threshold points with SDF values more than a certain threshold. However, such procedure is not differentiable with respect to the input latent vector $z_{sdf}$. Instead, the optimizer module 221 utilizes the fact that deriving an SDF value $s_i$ with respect to its input coordinate $x_i$ yields a normal at this point, which can be computed in a single backward pass as shown in FIG. 4. FIG. 4 shows an example of Octree-based object extraction and uses the following Equation (3):

$$n_i = \frac{\partial G(x_i; z_{sdf})}{\partial x_i} \quad (3)$$

The optimizer module 221 then projects the input query point onto the surface position $p_i$ using the recovered normal $n_i$ defining the direction to the closest surface and SDF value $s_i$ providing the distance to the surface:

$$p_i = x_i - \frac{\partial G(x_i; z_{sdf})}{\partial x_i} G(x_i, z_{sdf}) \quad (4)$$

Octree-Based Point Sampling

A brute force solution to recover shapes from a learned SDF representation using conventional methods can be obtained by estimating SDF values for a large collection of grid points. According to such conventional methods, to obtain clean surface projections one would then disregard all points $x_i$ outside a narrow band ($|s_i|>0.03$) of the surface. However, such procedure can be extremely inefficient both memory- and compute-wise. For example, for a grid size of $60^3=216000$ points, only around 1600 surface points are extracted (accounting to 0.7% of the total number of points).

The solution according to examples of the disclosure, in contrast, is an Octree-based procedure to more efficiently extract points. The solution defines a coarse voxel grid and estimates SDF values for each of the points using the trained SDF network. Then voxels having SDF values that are larger than the voxel grid size for this resolution level are disregarded. The remaining voxels are subdivided each generating eight new voxels. The optimizer module 221 repeats this procedure until the desired resolution level is reached. In an example implementation as shown in FIG. 4, the optimizer module 221 starts from Level of Detail (LoD) 3 and traverses up to LoD 6 depending on the desired resolution level. Finally, when points are extracted the optimizer module 221 estimates their SDF values and normals and projects them onto the object surface. The pseudo-code implementation of the Octree-based surface extraction is provided in Algorithm 1 below with the visualization shown in FIG. 4.

---

Algorithm 1: Octree-based implicit surface extraction

Input: $x \in \mathbb{R}^3$ grid points, $l \in \mathbb{L}$ grid levels, $z_{sdf}$ and $z_{tex} \in \mathbb{R}^{64}$ latent vectors
Output: pcd $\in \mathbb{R}^3$ surface points, nrm $\in \mathbb{N}^3$ normals, col $\in \mathbb{C}^3$ colors
/* Extract object grid (no grad)                                              */
1  for $l \in \{1,...,N_{LoD}\}$ do
2    | sdf $\leftarrow$ G($x_l$, $z_{sdf}$) ;         // regress sdf values
3    | occ $\leftarrow$ sdf < getCellSize(l) ;    // estimate cell occupancy
4    | $x_{l_{occ}} \leftarrow x_l$[occ] ;        // remove unoccupied cells
5    | $x_{l+1} \leftarrow$ subdivide($x_{l_{occ}}$) ;  // subdivide cells to go to next LoD
6  end
/* Extract object shape and appearance                                        */
7  nrm $\leftarrow$ backprop(sdf) ;     // analytically estimate surface normals
8  pcd $\leftarrow$ x − nrm * sdf ;      // project points onto the surface
9  col $\leftarrow$ $t_\theta$(pcd, $z_{sdf}$, $z_{tex}$);    // regress surface texture
10 return pcd. nrm, col

---

Inference

As noted above, in Stage I predictions are performed using the single-shot model as described in this disclosure. Object detection is performed using peak detection on the outputs of predicted heatmaps ($\hat{Y}$). Each detected center point ($x_i$,$y_i$) corresponds to a maxima in the heatmap output ($\hat{Y}$). In Stage II shape, appearance, and 6D pose and size codes of each object are sampled from the output of the task-specific heads 280a-c at the detected center location ($x_i$,$y_i$) via $z_{sdf}$=$Y_{sdf}$($x_i$,$y_i$), $z_{tex}$=$Y_{tex}$($x_i$,$y_i$), and $\tilde{P}$=$Y_p$($x_i$,$y_i$).

In Stage III the predicted shape, appearance, pose, and size codes are used as an initial estimate to further refine through the differentiable optimization pipeline of this disclosure. The optimizer module 221 takes as its input the predicted implicit shapes in the canonical frame of reference along with the masks predictions ($\hat{M}$), color codes ($z_{tex}$) and extracted 3×3 rotation $$\hat{R}_i^p,$$

3D translation vector

$$\hat{t}_i^p$$

and 1D scales

$$\hat{s}_i^p$$

from recovered pose $\tilde{P}$. Although one option may be to consider mean class predictions as initial priors, examples of the disclosure mainly utilize the regressed outputs of shape, appearance, and pose for the optimization pipeline since the initial estimates can be very robust. The optimizer module

221 utilizes the predicted SDF to recover the complete surface of each object, in a coarse-to-fine manner, using the proposed differentiable zero-iso-surface projection. After fixing the decoder (G) parameters, the optimizer module 221 optimizes the feature vector $z_{sdf}$ by estimating the nearest neighbor between the predicted projected pointclouds and masked pointclouds obtained from the depth map and predicted masks ($\hat{M}$) of each object. In essence, a shape code $z_{sdf}$ is refined using the Maximum-a-Posterior (MAP) estimation as follows:

$$z_{sdf}=\arg_z \min(L(D(G(z, x)), P_d \tag{5}$$

In equation (5) D denotes the differentiable iso-surface projection and $P_d$ denotes the pointclouds obtained from masked depth maps. The optimizer module 221 further optimizes the RGB component similarly by optimizing the difference in colors between the masked image color values ($C_d$) and colors obtained using the regressed color codes decoded by the texture field ($t_\theta$) $z_{tex}$=$\arg_z$ min (L(D($t_\theta$(z, x)), $C_d$. The optimizer module 221 further allows $t_\theta$ weights to change to allow for a finer level of reconstruction. Accordingly 2D masks are used to obtain object-centric colored pointclouds for the differential optimization.

Example Implementations

In embodiments, a differentiable object shape representation allows further pose optimization, improving the quality of the object detections. A teacher model refines object detections using a differentiable shape and texture test-time optimization. Once the initial labels have been refined, the training set is augmented with the new labels, and the new labels are used to re-train the student model with the augmented label set, leading to improved performance while maintaining real-time capabilities. The differentiable shape and texture database stores geometries of the objects in the form of signed distance fields and stores their appearance in the form of luminance fields, and allows smooth interpolation between objects in the latent space (leading to a disentangled and easily interpretable latent space of objects) as well as object re-identification and retrieval. Differentiability makes it possible to smoothly traverse and optimize over the shapes and appearances.

Example embodiments provide an end-to-end pipeline recovering 3D labels from RGB-D images. Example embodiments can simultaneously detect, reconstruct and localize all unknown object instances in the 3D space. In essence, shape reconstruction and pose and size estimation are regarded as a point-based representation problem where each object's complete 3D information is represented by its center point in the 2D spatial image. Formally, given an RGB-D single-view observation, embodiments can reconstruct the complete shape and textures of individual objects and the 6D pose and scales of all object instances in the 3D scene. First, a single-shot detection pipeline is employed that detects object instances as heatmaps in a per-pixel manner featuring pyramid networks. Second, multiple heads are employed for shape prediction, texture prediction, pose and size prediction, and mask prediction. A pre-training strategy is employed to learn a database of shape and texture priors from a large collection of textured CAD models. In essence, embodiments use both sparse (pointcloud) and an implicit representation (SDFs) for shapes and a dense RGB grid for textures. First shapes are optimized and then a texture field is learned on the learnt implicit surface. Then 2D heatmaps, textures codes, and shape codes are jointly optimized to predict shapes, pose and sizes in a single-forward pass. Moreover, an optimization pipeline is employed during inference to optimize the shape, appearance, and pose jointly using the input observation i.e., RGB and depth to improve the generalization performance on unseen novel object instances.

Accordingly example embodiments provide a single-shot pipeline to regress shape, appearance, and pose latent codes along with the masks of each object instance, which is then further refined in a sparse-to-dense fashion. A disentangled shape and appearance code is first learned to embed objects in their respective shape and appearance space. An Octree-based differentiable optimization step allows to further improve object shape, pose, and appearance simultaneously under the learned latent space, in an analysis-by-synthesis fashion. A joint implicit textured object representation allows to accurately identify and reconstruct novel unseen objects without having access to their 3D meshes. Example embodiments can accurately regress the shape, appearance, and pose of novel objects in the real-world with minimal fine-tuning.

In example embodiments, object instances are represented as center key-points in a spatial 2D grid. Regression is performed on the complete 3D information, i.e., object shape and appearance codes along with the object masks and 6D pose and sizes at each object's spatial center point. A joint implicit shape and appearance database of signed distance and texture field priors is utilized, to embed object instances in a unique space and learn from a large collection of CAD models. Differentiable optimization of implicit shape and appearance representation is used to iteratively improve shape, pose, size, and appearance jointly in an analysis-by-synthesis fashion. Technical improvements include alleviating the sampling inefficiency inherent in signed distance field shape representations by using an Octree-based point sampling which can lead to significant time and memory improvements as well as increased reconstruction quality. The generalizable, disentangled shape and appearance space coupled with an efficient Octree-based differentiable optimization procedure allows to identify and reconstruct unseen object instances without access to their ground truth meshes.

In an example implementation, for training, the CAMERA dataset is used which comprises 300K synthetic images, of which 25K are hold-out for evaluation. The training dataset is a publicly available NOCS dataset from the paper by Wang, H., Sridhar, S., Huang, J., Valentin, J., Song, S., Guibas, L J entitled "Normalized Object Coordinate Space for category-level 6 d object pose and size estimation," In: CVPR (2019). The training dataset includes 1085 object models from 6 different categories—bottle, bowl, camera, can, laptop and mug whereas the evaluation dataset includes 184 different models. The REAL dataset train-set comprises 7 scenes with 4300 images, and test-set comprises 6 scenes with 2750 real-world images. In an example implementation the ShAPO system is sequentially trained first on the CAMERA set with minimal fine-tuning on the Real training set. For SDF, an MLP with 8 layers and hidden size of 512 is used. For color, a Siren MLP is used as it can fit higher frequencies better. The SDF and color MLPs are trained on all categories for 2000 epochs. Pytorch is used for the models and training pipeline implementation. For optimization, an adaptive learning rate is used which varies with the obtained masks of each object since masks can capture the confidence of heatmap prediction during detection. Each object is optimized for 200 iterations.

Figure 7:
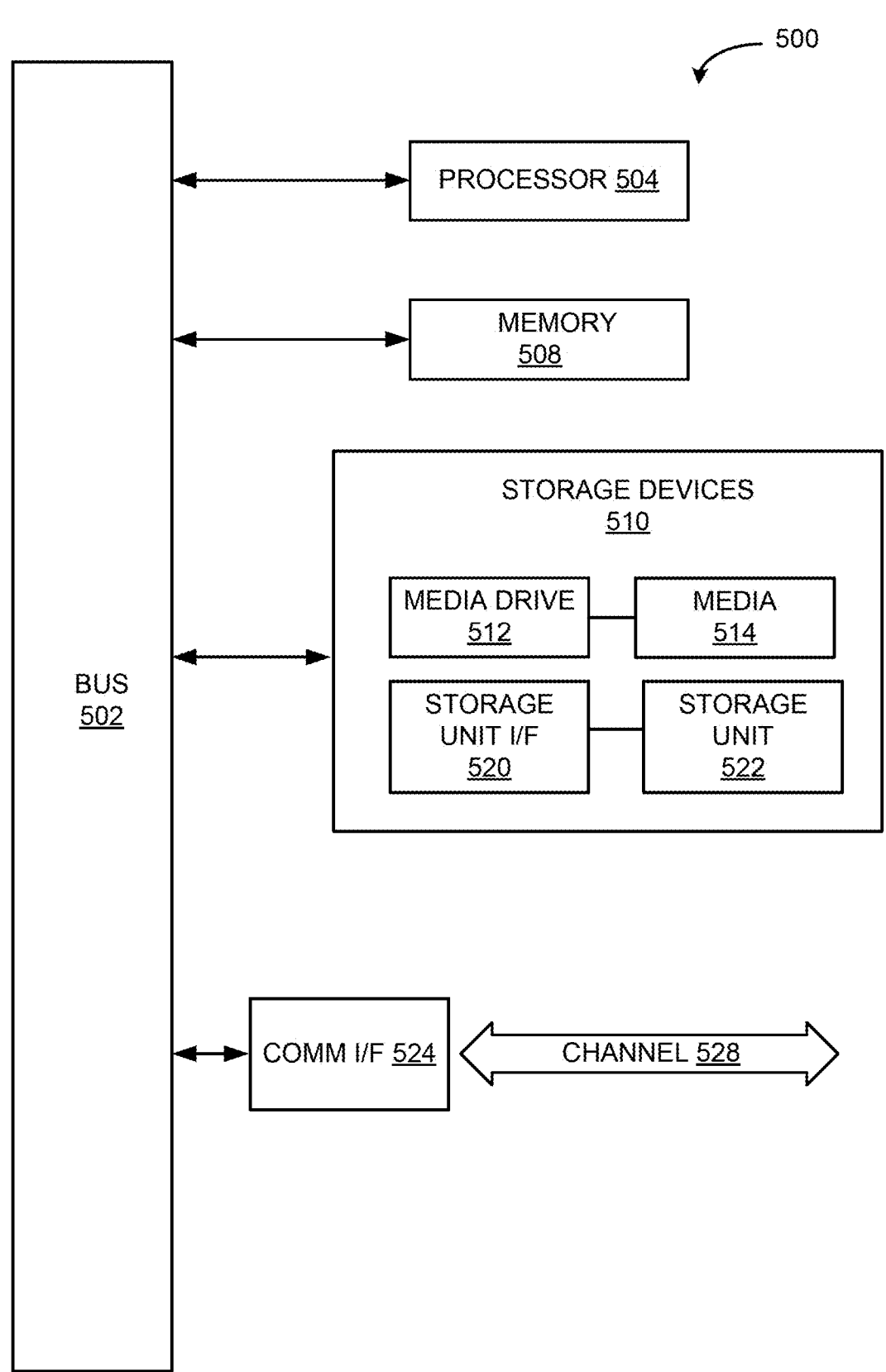
FIG. 7 is an example computing component that may be used to implement various features of embodiments described in the present disclosure.

As used herein, the terms circuit and component might describe a given unit of functionality that can be performed in accordance with one or more embodiments of the present application. As used herein, a component might be implemented utilizing any form of hardware, software, or a combination thereof. For example, one or more processors, controllers, ASICs, PLAs, PALs, CPLDs, FPGAs, logical components, software routines or other mechanisms might be implemented to make up a component. Various components described herein may be implemented as discrete components or described functions and features can be shared in part or in total among one or more components. In other words, as would be apparent to one of ordinary skill in the art after reading this description, the various features and functionality described herein may be implemented in any given application. They can be implemented in one or more separate or shared components in various combinations and permutations. Although various features or functional elements may be individually described or claimed as separate components, it should be understood that these features/functionality can be shared among one or more common software and hardware elements. Such a description shall not require or imply that separate hardware or software components are used to implement such features or functionality.

Where components are implemented in whole or in part using software, these software elements can be implemented to operate with a computing or processing component capable of carrying out the functionality described with respect thereto. One such example computing component is shown in FIG. 7, which may be implemented in many applications including robotics and/or vehicle applications including but not limited to grasping, manipulation, augmented reality, scene understanding, autonomous navigation, or others. Various embodiments are described in terms of this example-computing component 500. After reading this description, it will become apparent to a person skilled in the relevant art how to implement the application using other computing components or architectures.

Referring now to FIG. 7, computing component 500 may represent, for example, computing or processing capabilities found within a self-adjusting display, desktop, laptop, notebook, and tablet computers. They may be found in hand-held computing devices (tablets, PDA's, smart phones, cell phones, palmtops, etc.). They may be found in workstations or other devices with displays, servers, or any other type of special-purpose or general-purpose computing devices as may be desirable or appropriate for a given application or environment. Computing component 500 might also represent computing capabilities embedded within or otherwise available to a given device. For example, a computing component might be found in other electronic devices such as, for example, portable computing devices, and other electronic devices that might include some form of processing capability.

Computing component 500 might include, for example, one or more processors, controllers, control components, or other processing devices. This can include a processor, and/or any one or more of the components making up the ShAPO system 170, the per-pixel detection module 219, or the prediction module 220, the optimizer module 221. Processor 504 might be implemented using a general-purpose or special-purpose processing engine such as, for example, a microprocessor, controller, or other control logic. Processor 504 may be connected to a bus 502. However, any communication medium can be used to facilitate interaction with other components of computing component 500 or to communicate externally.

Computing component 500 might also include one or more memory components, simply referred to herein as main memory 508. For example, random access memory (RAM) or other dynamic memory, might be used for storing information and instructions to be executed by processor 504. Main memory 508 might also be used for storing temporary variables or other intermediate information during execution of instructions to be executed by processor 504. Computing component 500 might likewise include a read only memory ("ROM") or other static storage device coupled to bus 502 for storing static information and instructions for processor 504.

The computing component 500 might also include one or more various forms of information storage mechanism 510, which might include, for example, a media drive 512 and a storage unit interface 520. The media drive 512 might include a drive or other mechanism to support fixed or removable storage media 514. For example, a hard disk drive, a solid-state drive, a magnetic tape drive, an optical drive, a compact disc (CD) or digital video disc (DVD) drive (R or RW), or other removable or fixed media drive might be provided. Storage media 514 might include, for example, a hard disk, an integrated circuit assembly, magnetic tape, cartridge, optical disk, a CD or DVD. Storage media 514 may be any other fixed or removable medium that is read by, written to or accessed by media drive 512. As these examples illustrate, the storage media 514 can include a computer usable storage medium having stored therein computer software or data.

In alternative embodiments, information storage mechanism 510 might include other similar instrumentalities for allowing computer programs or other instructions or data to be loaded into computing component 500. Such instrumentalities might include, for example, a fixed or removable storage unit 522 and an interface 520. Examples of such storage units 522 and interfaces 520 can include a program cartridge and cartridge interface, a removable memory (for example, a flash memory or other removable memory component) and memory slot. Other examples may include a PCMCIA slot and card, and other fixed or removable storage units 522 and interfaces 520 that allow software and data to be transferred from storage unit 522 to computing component 500.

Computing component 500 might also include a communications interface 524. Communications interface 524 might be used to allow software and data to be transferred between computing component 500 and external devices. Examples of communications interface 524 might include a modem or softmodem, a network interface (such as Ethernet, network interface card, IEEE 802.XX or other interface). Other examples include a communications port (such as for example, a USB port, IR port, RS232 port Bluetooth® interface, or other port), or other communications interface. Software/data transferred via communications interface 524 may be carried on signals, which can be electronic, electromagnetic (which includes optical) or other signals capable of being exchanged by a given communications interface 524. These signals might be provided to communications interface 524 via a channel 528. Channel 528 might carry signals and might be implemented using a wired or wireless communication medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to transitory or non-transitory media. Such media may be, e.g., memory 508, storage unit 520, media 514, and channel 528. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing component 500 to perform features or functions of the present application as discussed herein.

It should be understood that the various features, aspects and functionality described in one or more of the individual embodiments are not limited in their applicability to the particular embodiment with which they are described. Instead, they can be applied, alone or in various combinations, to one or more other embodiments, whether or not such embodiments are described and whether or not such features are presented as being a part of a described embodiment. Thus, the breadth and scope of the present application should not be limited by any of the above-described exemplary embodiments.

Terms and phrases used in this document, and variations thereof, unless otherwise expressly stated, should be construed as open ended as opposed to limiting. As examples of the foregoing, the term "including" should be read as meaning "including, without limitation" or the like. The term "example" is used to provide exemplary instances of the item in discussion, not an exhaustive or limiting list thereof. The terms "a" or "an" should be read as meaning "at least one," "one or more" or the like; and adjectives such as "conventional," "traditional," "normal," "standard," "known." Terms of similar meaning should not be construed as limiting the item described to a given time period or to an item available as of a given time. Instead, they should be read to encompass conventional, traditional, normal, or standard technologies that may be available or known now or at any time in the future. Where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "component" does not imply that the aspects or functionality described or claimed as part of the component are all configured in a common package. Indeed, any or all of the various aspects of a component, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A computer-implemented method, comprising:
outputting sampled shape and appearance codes from respective heatmap heads into respective shape and appearance multi-layer perceptrons (MLPs), outputting sampled 6D pose and size codes from a respective heatmap head into a differential iso-surface projection engine, and outputting 2D masks from a respective heatmap head into an optimizer, wherein the sampled codes and 2D masks serve as initial estimates of each code and 2D mask;
training the respective shape and appearance MLPs using shape and appearance priors from an implicit joint differentiable database, to obtain further shape and appearance codes;
inputting the further shape and appearance codes into the differential iso-surface projection engine; during training of the MLPs, outputting from the differential iso-surface projection engine into the optimizer latest shape, appearance, 6D pose and size codes, and 2D masks;
using an Octree-based coarse-to-fine differentiable optimization that refines from a coarse resolution to a higher resolution by iteratively increasing an Octree resolution level until a desired resolution level is reached to jointly optimize the latest shape, appearance, 6D pose and size codes, and 2D masks, using the database, and return the optimized codes and 2D masks to the respective MLPs; and
recovering an object surface from the latest shape codes to the desired resolution level using the differential iso-surface projection engine.

2. The computer-implemented method of claim 1, further comprising, before the outputting step:
inputting, into the heatmap heads, a center location of each object based on peak values detected from heatmaps; and sampling, from an output of each heatmap head, the shape, appearance, and 6D pose and size codes, and the 2D masks.

3. The computer-implemented method of claim 2, wherein the inputting step further comprises:
inputting an RGB-D image; extracting RGB features and Depth features from the inputted RGB-D image;
concatenating the extracted RGB features and the extracted Depth features along a convolutional channel to generate concatenated features;
generating a feature pyramid based upon the concatenated RGB features and the concatenated Depth features;
predicting object-centric heatmaps based upon the feature pyramid; determining peak values in the heatmaps corresponding to centers of the objects in the RGB-D image; and
detecting and outputting the center location of each object based on the peak values in the heatmaps.

4. The computer-implemented method of claim 1, further comprising:
training the respective shape and appearance MLPs using an RGB loss minimizing function.

5. The computer-implemented method of claim 1, wherein the database represents shapes as Signed Distance Fields (SDF) and appearance as Texture Fields (TF).

6. The computer-implemented method of claim 1, wherein the optimizing regresses 3D rotation, 3D translation, and 1D scales.

7. The computer-implemented method of claim 1, wherein the optimizing uses a combined loss minimizing function.

8. A system comprising:
a processor; and a memory coupled to the processor to store instructions which, when executed by the processor, cause the processor to perform operations, the operations comprising:
inputting, into heatmap heads, a center location of each object based on peak values detected from heatmaps;
sampling, from an output of each heatmap head, shape, appearance, and 6D pose and size codes, and 2D masks;
outputting sampled shape and appearance codes from respective heatmap heads into respective shape and appearance multi-layer perceptrons (MLPs), outputting 6D pose and size codes into a differential iso-surface projection engine, and outputting 2D masks into an optimizer, wherein the sampled codes and 2D masks serve as initial estimates of each code and 2D mask;
training the respective shape and appearance MLPs using shape and appearance priors from an implicit joint differentiable database, to obtain further shape and appearance codes;
inputting the further shape and appearance codes into the differential iso-surface projection engine;
during training of the MLPs, outputting from the differential iso-surface projection engine into the optimizer latest shape, appearance, 6D pose and size codes, and 2D masks;
using an Octree-based coarse-to-fine differentiable optimization that refines from a coarse resolution to a higher resolution by iteratively increasing an Octree resolution level until a desired resolution level is reached to jointly optimize the latest shape, appearance, 6D pose and size codes, and 2D masks, using the database, and return the optimized codes and 2D masks to the respective MLPs; and
recovering an object surface from the latest shape codes to the desired resolution level using the differential iso-surface projection engine.

9. The system of claim 8, the operations further comprising:
training the respective shape and appearance MLPs using an RGB loss minimizing function.

10. The system of claim 8, wherein the database represents shapes as Signed Distance Fields (SDF) and appearance as Texture Fields (TF).

11. The system of claim 8, wherein the first inputting step of the operations further comprises:
inputting an RGB-D image; extracting RGB features and Depth features from the inputted RGB-D image;
concatenating the extracted RGB features and the extracted Depth features along a convolutional channel to generate concatenated features;
generating a feature pyramid based upon the concatenated RGB features and the concatenated Depth features;

predicting object-centric heatmaps based upon the feature pyramid;

determining peak values in the heatmaps corresponding to centers of the objects in the RGB-D image; and detecting and outputting the center location of each object based on the peak values in the heatmaps.

12. The system of claim 8, wherein the optimizing regresses 3D rotation, 3D translation, and 1D scales.

13. The system of claim 8, wherein the optimizing uses a combined loss minimizing function.

14. A non-transitory machine-readable medium having instructions stored therein, which, when executed by a processor, cause the processor to perform operations, the operations comprising:

outputting sampled shape and appearance codes from respective heatmap heads into respective shape and appearance multi-layer perceptrons (MLPs), outputting sampled 6D pose and size codes from a respective heatmap head into a differential iso-surface projection engine, and outputting 2D masks from a respective heatmap head into an optimizer, wherein the sampled codes and 2D masks serve as initial estimates of each code and 2D mask;

training the respective shape and appearance MLPs using shape and appearance priors from an implicit joint differentiable database, to obtain further shape and appearance codes;

inputting the further shape and appearance codes into the differential iso-surface projection engine;

during training of the MLPs, outputting from the differential iso-surface projection engine into the optimizer latest shape, appearance, 6D pose and size codes, and 2D masks;

using an Octree-based coarse-to-fine differentiable optimization that refines from a coarse resolution to a higher resolution by iteratively increasing an Octree resolution level until a desired resolution level is reached to jointly optimize the latest shape, appearance, 6D pose and size codes, and 2D masks, using the database, and return the optimized codes and 2D masks to the respective MLPs; and recovering an object surface from the latest shape codes to the desired resolution level using the differential iso-surface projection engine.

15. The non-transitory machine-readable medium of claim 14, the operations further comprising, before the outputting step:

inputting, into the heatmap heads, a center location of each object based on peak values detected from heatmaps; and sampling, from an output of each heatmap head, the shape, appearance, and 6D pose and size codes, and the 2D masks.

16. The non-transitory machine-readable medium of claim 14, wherein the first inputting step of the operations further comprises:

inputting an RGB-D image; extracting RGB features and Depth features from the inputted RGB-D image;

concatenating the extracted RGB features and the extracted Depth features along a convolutional channel to generate concatenated features;

generating a feature pyramid based upon the concatenated RGB features and the concatenated Depth features;

predicting object-centric heatmaps based upon the feature pyramid; determining peak values in the heatmaps corresponding to centers of the objects in the RGB-D image; and detecting and outputting the center location of each object based on the peak values in the heatmaps.

17. The non-transitory machine-readable medium of claim 14, the operations further comprising:

training the respective shape and appearance MLPs using an RGB loss minimizing function.

18. The non-transitory machine-readable medium of claim 14, wherein the database represents shapes as Signed Distance Fields (SDF) and appearance as Texture Fields (TF).

19. The system of claim 8, wherein the system is a vehicle control system.

20. The system of claim 8, wherein the system is a robotics system.

* * * * *